US009171636B2

(12) United States Patent
Chang et al.

(10) Patent No.: US 9,171,636 B2
(45) Date of Patent: Oct. 27, 2015

(54) HOT CARRIER GENERATION AND PROGRAMMING IN NAND FLASH

(71) Applicant: Macronix International Co., Ltd., Hsinchu (TW)

(72) Inventors: Kuo-Pin Chang, Yuanli Township (TW); Wen-Wei Yeh, Bade (TW); Chih-Shen Chang, New Taipei (TW); Hang-Ting Lue, Hsinchu (TW)

(73) Assignee: Macronix International Co. Ltd., Hsinchu (TW)

( * ) Notice: Subject to any disclaimer, the term of this patent is extended or adjusted under 35 U.S.C. 154(b) by 89 days.

(21) Appl. No.: 13/940,010

(22) Filed: Jul. 11, 2013

(65) Prior Publication Data

US 2014/0211563 A1    Jul. 31, 2014

Related U.S. Application Data

(60) Provisional application No. 61/757,730, filed on Jan. 29, 2013, provisional application No. 61/827,396, filed on May 24, 2013.

(51) Int. Cl.
*G11C 16/00*  (2006.01)
*G11C 16/34*  (2006.01)

(52) U.S. Cl.
CPC ........ *G11C 16/3459* (2013.01); *G11C 16/3427* (2013.01)

(58) Field of Classification Search
CPC ..................................................... G11C 16/00
USPC ................................................... 365/185.18
See application file for complete search history.

(56) References Cited

U.S. PATENT DOCUMENTS

| 5,374,564 | A  | 12/1994 | Bruel |
| 5,993,667 | A  | 11/1999 | Overman |
| 6,034,882 | A  | 3/2000  | Johnson et al. |
| 6,906,361 | B2 | 6/2005  | Zhang |
| 6,906,940 | B1 | 6/2005  | Lue |

(Continued)

FOREIGN PATENT DOCUMENTS

| EP | 1936681 A1 | 6/2008 |
| EP | 2048709 A2 | 4/2009 |

OTHER PUBLICATIONS

Choi, Sung-Jin, et al., "Performance Breakthrough in NOR Flash Memory with Dopant-Segregated Schottky-Barrier (DSSB) SONOS Devices", Jun. 2009 Symposium on VLSI Technology Digest of Technical Papers, pp. 222-223.

(Continued)

*Primary Examiner* — Amir Zarabian
*Assistant Examiner* — Min Huang
(74) *Attorney, Agent, or Firm* — Kenta Suzue; Haynes Beffel & Wolfeld LLP

(57) ABSTRACT

A memory device is described that includes a three-dimensional array of memory cells having a plurality of levels of memory cells accessed by a plurality of word lines, and a plurality of bit lines. Control circuitry is coupled to the plurality of word lines and the plurality of bit lines. The control circuitry is adapted for programming a selected memory cell in a selected level of the array and on a selected word line, by hot carrier generation assisted FN tunneling, while inhibiting disturb in unselected memory cells in unselected levels and in the selected level and on unselected word lines by self-boosting.

23 Claims, 24 Drawing Sheets

(56) References Cited

U.S. PATENT DOCUMENTS

| | | | |
|---|---|---|---|
| 7,081,377 | B2 | 7/2006 | Cleeves |
| 7,129,538 | B2 | 10/2006 | Lee et al. |
| 7,177,169 | B2 | 2/2007 | Scheuerlein |
| 7,274,594 | B2 | 9/2007 | Pascucci et al. |
| 7,315,474 | B2 | 1/2008 | Lue |
| 7,382,647 | B1 | 6/2008 | Gopalakrishnan |
| 7,420,242 | B2 | 9/2008 | Lung |
| 7,473,589 | B2 | 1/2009 | Lai et al. |
| 7,709,334 | B2 | 5/2010 | Lai et al. |
| 7,851,849 | B2 | 12/2010 | Kiyotoshi |
| 2005/0280061 | A1 | 12/2005 | Lee |
| 2006/0198195 | A1* | 9/2006 | Hemink et al. .......... 365/185.18 |
| 2007/0140001 | A1 | 6/2007 | Motoi et al. |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0180994 | A1 | 7/2008 | Katsumata et al. |
| 2008/0247230 | A1 | 10/2008 | Lee et al. |
| 2009/0097321 | A1 | 4/2009 | Kim et al. |
| 2009/0184360 | A1 | 7/2009 | Jin et al. |
| 2010/0120226 | A1 | 5/2010 | Yamazaki et al. |
| 2010/0270593 | A1 | 10/2010 | Lung et al. |
| 2011/0273931 | A1* | 11/2011 | Bhattacharyya .............. 365/184 |
| 2011/0286283 | A1 | 11/2011 | Lung et al. |
| 2011/0305088 | A1* | 12/2011 | Huang et al. ............. 365/185.15 |
| 2012/0007167 | A1 | 1/2012 | Hung et al. |
| 2012/0052674 | A1* | 3/2012 | Lee et al. ....................... 438/591 |
| 2012/0081962 | A1 | 4/2012 | Tsai et al. |
| 2012/0195125 | A1* | 8/2012 | Choe et al. ............... 365/185.15 |
| 2012/0230116 | A1* | 9/2012 | Goda et al. ............... 365/185.25 |
| 2013/0088920 | A1 | 4/2013 | Huang et al. |

OTHER PUBLICATIONS

Fukuzumi, Yoshiaki, et al., "Optimal Integration and Characteristics of Vertical Array Devices for Ultra-High Density, Bit-cost Scallable Flash Memory", IEEE Dec. 2007, pp. 449-452.

Hsu, Tzu-Hsuan, et al., "Study of Sub-30nm Thin File Transistor (TFT) Charge-Trapping (CT) Devices for 3D NAND Flash Application", 2009 IEEE, Dec. 7-9, 2007, pp. 27.4.1-27.4.4.

Hubert, A., et al., "A stacked SONOS technology, up to 4 levels and 6nm crystalline nanowires, with gate-all-around or independent gates (Ø-Flah), suitable for full 3D integration", IEEE 2009, Dec. 7-9, 2009, pp. 27.6.1-27.6.4.

Jang, Jaehoon, et al., "Vertical Cell Array using TCAT (Terabit Cell Array Transistor) Technology for Ultra High Density NAND Flash Memory", 2009 Symposium on VLSI Technology Digest of Technical Papers, Jun. 16-18, 2009, pp. 192-193.

Johnson, Mark, et al., "512-Mb PROM With a Three-Dimensional Array of Diode/Antifuse Memory Cells", Nov. 2003; IEEE Journal of Solid-State Circuits, 38(11):1920-1928.

Jung, Soon-Moon, et al., "Three Dimensionally Stacked NAND Flash Memory Technology Using Stacking Single Crystal Si Layers on ILD and TANOS Structure for Beyond 30 nm Node", IEEE IEDM 2006, Dec. 11-13, 4 pages.

Katsumata, Ryota, et al., "Pipe-shaped BiCS Flash Memory with 16 Stacked Layers and Multi-Level-Cell Operation for Ultra High Density Storage Devices", 2009 Symposium on VLSI Technology Digest of Technical Papers, Jun. 16-18, 2009, pp. 136-137.

Kim, Jiyoung, et al., "Novel Vertical-Stacked-Array-Transistor (VSAT) for Ultra-High-Density and Cost-Effective NAND FLash Memory Devices and SSD (Solid State Drive)", Jun. 2009 Symposium on VLSI Technology Digest of Technical Papers, pp. 186-187.

Kim, Jiyoung, et al., "Novel 3-D Structure for Ultra High Density Flash Memory with VRAT (Vertical-Recess-Array-Transistor) and PIPE (Planarized Integration on the same PlanE)", IEEE 2008 Symposium on VLSI Technology Digest of Technical Papers, Jun. 17-18, 2008, pp. 122-123.

Kim, Wonjoo, et al., "Multi-Layered Vertical Gate NAND Flash Overcoming Stacking Limit for Terabit Density Storage", 2009 Symposium on VLSI TEchnology Digest of Technical Papers, Jun. 16-18, 2009, pp. 188-189.

Lai, Erh-Kun, et al., "A Multi-Layer Stackable Thin-Film Transistor (TFT) NAND-Type Flash Memory", Electron Devices Meeting, 2006, IEDM '06 International, Dec. 11-13, 2006, pp. 1-4.

Lai, Sheng-Chih, et al., "Highly Reliable MA BE-SONOS (Metal-Al2O3 Bandgap Engineered SONOS) Using a SiO2 Buffer Layer", VLSI Technology, Systems and Applications, 2008, VLSI-TSA 2008 International Symposium on Apr. 21-23, 2008, pp. 58-59.

Lue, Hang-Ting, et al., "A Novel Buried-Channel FinFET BE-SONOS NAND Flash with Improved Memory Window and Cycling Endurance," 2009 Symposium on VLSI Technology Digest of Technical Papers, Jun. 16-18, 2009, pp. 224-225.

Paul, Bipul C., et al., "Impact of a Process Variation on Nanowire and Nanotube Device Performance," IEEE Transactions on Electron Devices, vol. 54, No. 9, Sep. 2007, pp. 2369-2376.

Tanaka, H., et al., "Bit Cost Scalable Technology with Punch and Plug Process for Ultra High Density Flash Memory", VLSI Technology, 2007 IEEE Symposium on Jun. 12-14, 2007, pp. 14-15.

\* cited by examiner

Hot carrier assisted programming by source-side boosting

Hot carrier assisted programming by drain-side boosting

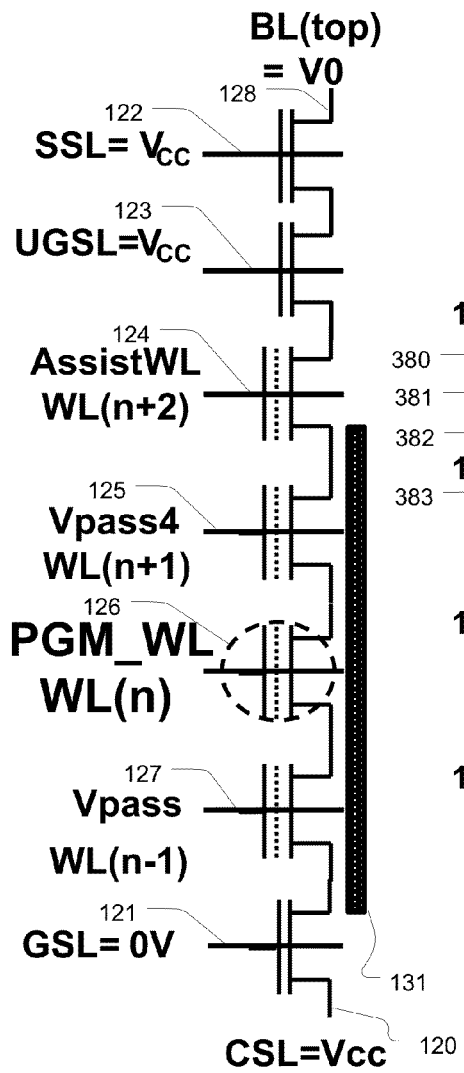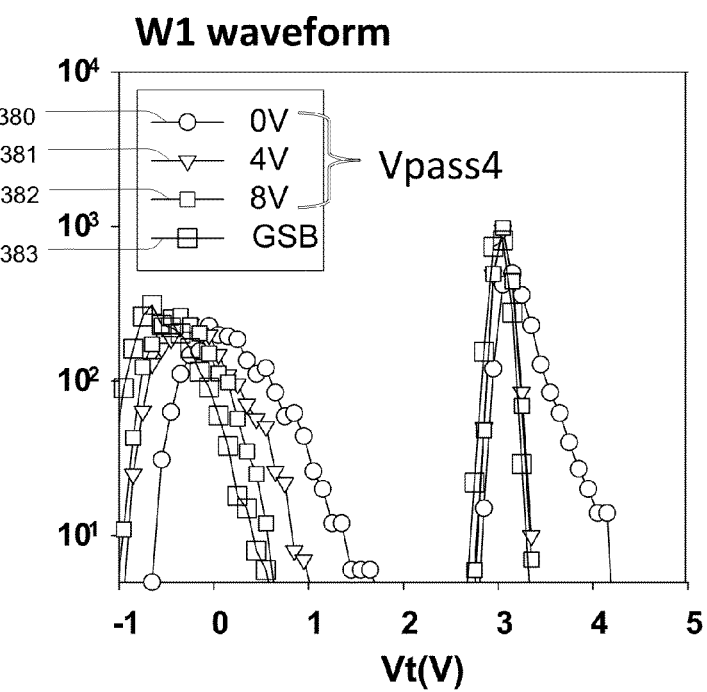
Fig. 26
Fig. 27

HOT CARRIER GENERATION AND PROGRAMMING IN NAND FLASH

REFERENCE TO RELATED APPLICATIONS

This application claims the benefit of U.S. Provisional Application 61/757,730 filed 29 Jan. 2013; and claims the benefit of U.S. Provisional Application 61/827,396 filed 24 May 2013, all of which are incorporated by reference.

BACKGROUND OF THE INVENTION

1. Field of the Invention

The present invention relates to flash memory technology, and more particularly to flash memory suitable for low voltage program and erase in a NAND configuration.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon body which can be in a strip (S), the tunnel dielectric layer is formed of silicon oxide (O), the charge storage layer is formed of silicon nitride (N), the blocking dielectric layer is formed of silicon oxide (O), and the gate comprises polysilicon (S).

Flash memory devices generally are implemented using NAND or NOR architectures, although others are known, including AND architectures. The NAND architecture is popular for its high density and high speed when applied to data storage applications. The NOR architecture is better suited to other applications, such as code storage, where random byte access is important. In a NAND architecture, the programming processes typically rely on Fowler-Nordheim (FN) tunneling, and require high voltages, such as on the order of 20 volts, and require high voltage transistors to handle them. The addition of high voltage transistors on integrated circuits, in combination with transistors used for logic and other data flow, introduces complexity in the manufacturing processes. This increased complexity in turn increases the costs of the devices.

Three-dimensional arrays of NAND memory feature even larger memory capacities in a relatively small volume. While programming a selected cell NAND array, nearby memory cells are subject to program disturb. Memory cells subject to program disturb include: a memory cell in the same NAND string; a memory cell accessed by the same word line and is in the same stack of semiconductor strips but is in a different layer of the stack; a memory cell accessed by the same word line and is in an adjacent stack of semiconductor strips though in the same layer; and a memory cell accessed by the same word line but is in an adjacent stack of semiconductor strips and in a different layer.

Hot carrier injection is memory technology suitable for low voltage programming operations, and which is configurable in a NAND architecture. Hot carrier injection in a NAND architecture has been previously described in U.S. application Ser. No. 12/797,994 filed on 10 Jun. 2010, which was published on 15 Dec. 2011 as US Patent Application Publication No 2011/0305088; and also in U.S. application Ser. No. 12/898,979 filed on 6 Oct. 2010, which was published on 5 Apr. 2012 as US Patent Application Publication No 2012/0081962, all of which are fully incorporated by reference.

It would be desirable to improve hot carrier injection in any of several ways, such as reducing program disturb.

SUMMARY OF THE INVENTION

A memory device is described that includes a three-dimensional array of memory cells having a plurality of levels of memory cells accessed by a plurality of word lines, and a plurality of bit lines. Control circuitry is coupled to the plurality of word lines and the plurality of bit lines. The control circuitry is adapted for programming a selected memory cell in a selected level of the array and on a selected word line, by hot carrier generation assisted FN tunneling, while inhibiting disturb in unselected memory cells in unselected levels and in the selected level and on unselected word lines by self-boosting.

In some embodiments of the technology, the memory cells comprise floating body, dual gate memory cells.

In some embodiments of the technology, the array comprises a plurality of stacks of semiconductor strips coupled via switches to contact pads, vertical word lines between the stacks with memory cells at cross points between the vertical word lines and the semiconductor strips, and the plurality of bit lines coupled to the contact pads.

In some embodiments of the technology, the array includes semiconductor strips on which memory cells are arranged in series, and including programming the selected memory cell during a program interval by:

biasing one of a first end and a second end of the series of the plurality of memory cells to a drain side voltage, and another of the first end and the second end to a source side voltage during the program interval, applying drain-side pass voltages to a first subset of the plurality of word lines between the selected word line and said one of the first end and the second end during the program interval, applying source-side pass voltages to a second subset of the plurality of word lines between the selected word line and said other of the first end and the second end during the program interval, applying a program voltage to the selected word line during the program interval; and applying a switching voltage to a switching word line of the plurality of word lines and to a corresponding memory cell of the plurality of memory cells to control hot-carrier programming during at least part of the program interval, the switching word line adjacent to the selected word line, and the corresponding memory cell adjacent to the selected memory cell.

In one aspect of the technology, a switching voltage is applied to a switching word line to control hot-carrier programming, and during the interval the switching voltage has different values of opposite polarities. In another of the technology, the program voltage applied to the selected word line is equal to the drain-side pass voltages and the source-side pass voltages. In yet another aspect of the technology, the interval includes multiple stages including at least a hot-carrier generation stage and a Fowler-Nordheim carrier injection stage.

In a further aspect of the technology, a program disturb relief voltage is applied to a program disturb relief word line of the plurality of word lines and to another corresponding memory cell of the plurality of memory cells to reduce program disturb during at least part of the program interval. The program disturb relief word line word line is adjacent to the switching word line, and said another corresponding memory cell is adjacent to the corresponding memory cell. The program disturb relief voltage is less than the drain-side pass voltages and the source-side pass voltages.

In various embodiments of the technology, the selected memory cell undergoes source-side boosting or drain-side boosting of hot-carrier programming of the selected memory cell Various embodiments of the technology have a body boost of selected and deselected pages of source-side and drain-side boosting.

Other aspects and advantages of the present invention can be seen on review of the drawings, the detailed description in the claims which follow.

BRIEF DESCRIPTION OF THE DRAWINGS

FIG. 26 is a circuit diagram of hot carrier assisted programming via drain-side boosting, showing the portions of the body that are boosted, with reduced program disturb.

FIGS. 27-31 are graphs characterizing aspects of the memory cells according to embodiments of the present invention.

DETAILED DESCRIPTION

A detailed description of embodiments of the present invention is provided with reference to the Figures.

Figure 1:
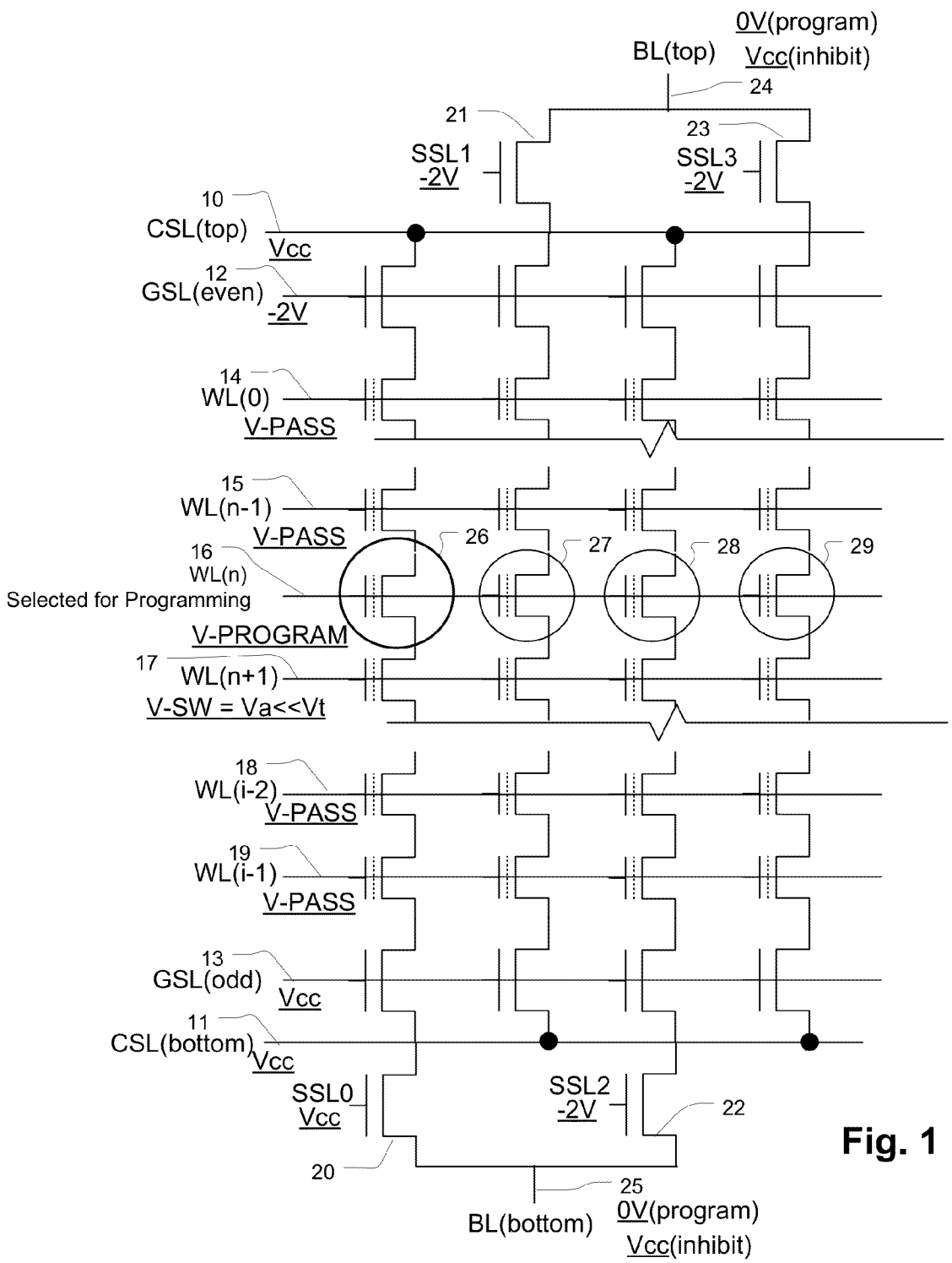
FIG. 1 is a circuit diagram of hot carrier assisted programming via source-side boosting.

FIG. 1 is a circuit diagram of hot carrier assisted programming via source-side boosting.

The memory cells shown herein may be dielectric charge trapping flash memory cells arranged in series to form a NAND string. One technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology and others. See, for an example vertical NAND structures, European Patent Application No. EP 2 048 709 by Kim et al. entitled "Non-volatile memory device, method of operating same and method of fabricating the same."

The plurality of flash memory cells is arranged in multiple strings extending in a bit line direction, orthogonal to word lines. The multiple strings are controlled by respective string select transistors SSL0 20, SSL1 21, SSL2 22, and SSL3 23. Word lines 0 through i−1 extend across a number of parallel NAND strings, including WL(0) 14, WL(n−1) 15, WL(n) 16, WL(n+1) 17, WL(i−2) 18, and WL(i−1). One end of the NAND strings is coupled to a string select transistor via a GSL transistor. Another end of the NAND strings is coupled to a CSL via another GSL transistor. The GSL transistors are controlled by GSL(even) line 12 and GSL(odd) 13 which are adjacent to the outer word lines. The common source lines CSL(top) 10 and CSL(bottom) 11 are adjacent to the GSL (even) line 12 and GSL(odd) 13 respectively. Adjacent parallel NAND strings have opposite orientations of CSL-to-bit line, and bit line-to-CSL. The NAND strings having a bit line-to-CSL orientation include NAND strings controlled by SSL transistors SSL1 21 and SSL3 23, which are coupled to bit line BL(top) 24. The NAND strings having a CSL-to-bit line orientation include NAND strings controlled by SSL transistors SSL0 20 and SSL2 22, which are coupled to bit line BL(bottom) 25. With any NAND string, the source line and the bit line are on opposite ends of the string. The source side of a transistor in a NAND string is more proximate to the source line coupled to the NAND string, than to the bit line coupled to the NAND string. The drain side of a transistor in a NAND string is more proximate to the bit line coupled to the NAND string, than to the source line coupled to the NAND string.

In this illustration, there are six memory cells in the NAND string for simplicity. In typical implementations, a NAND string may comprise 16, 32 or more memory cells arranged in series. The memory cells corresponding to the word lines have charge trapping structures between the word lines and channel regions in the semiconductor strip. The charge trapping structures in the memory cells can be dielectric charge trapping structures, floating gate charge trapping structures, or other flash memory structures suitable for programming using techniques described herein. Also, embodiments of NAND flash structures have been developed which are junction-free.

The bias arrangement shown in FIG. 1 performs hot-carrier assisted programming by source-side boosting on the memory string controlled by SSL0 20.

CSL(top) 10 and CSL(bottom) 11 are at Vcc. The selected BL(bottom) 25 is given 0V, but the unselected BL(top) 24 is given Vcc for program inhibit. WL(n+1) 17 acts as the assist gate, and is adjacent to the SSL/BL side of WL(n) 16 which is selected for programming. WL(n+1) 17 receives assist voltage Va<0 V, with a time delay until receiving turn-on voltage Vpass. Va gives local boosting between WL(n) 16 to GSL (even) 12 and causes additional hot-carrier injection into selected memory cell 26, until WL(n+1) 17 is turned on with Vpass. After WL(n+1) 17 is turned on, conventional +FN programming is performed, into selected memory cell 26.

Conventional+FN programming employs ISPP with a large Vpgm. The selected WL(n) 16 in unselected pages (i.e. strings, controlled by SSL1 21, SSL2 22, and SSL3 23) are inhibited by self-boosting to prevent FN disturb. Although WL(n+1) 17 cuts off the NAND string, both sides of the channel are boosted for unselected pages, thereby suppressing hot carriers into unselected memory cell 27, unselected memory cell 28, and unselected memory cell 28 that are also controlled by WL(n) 16.

Figure 2:
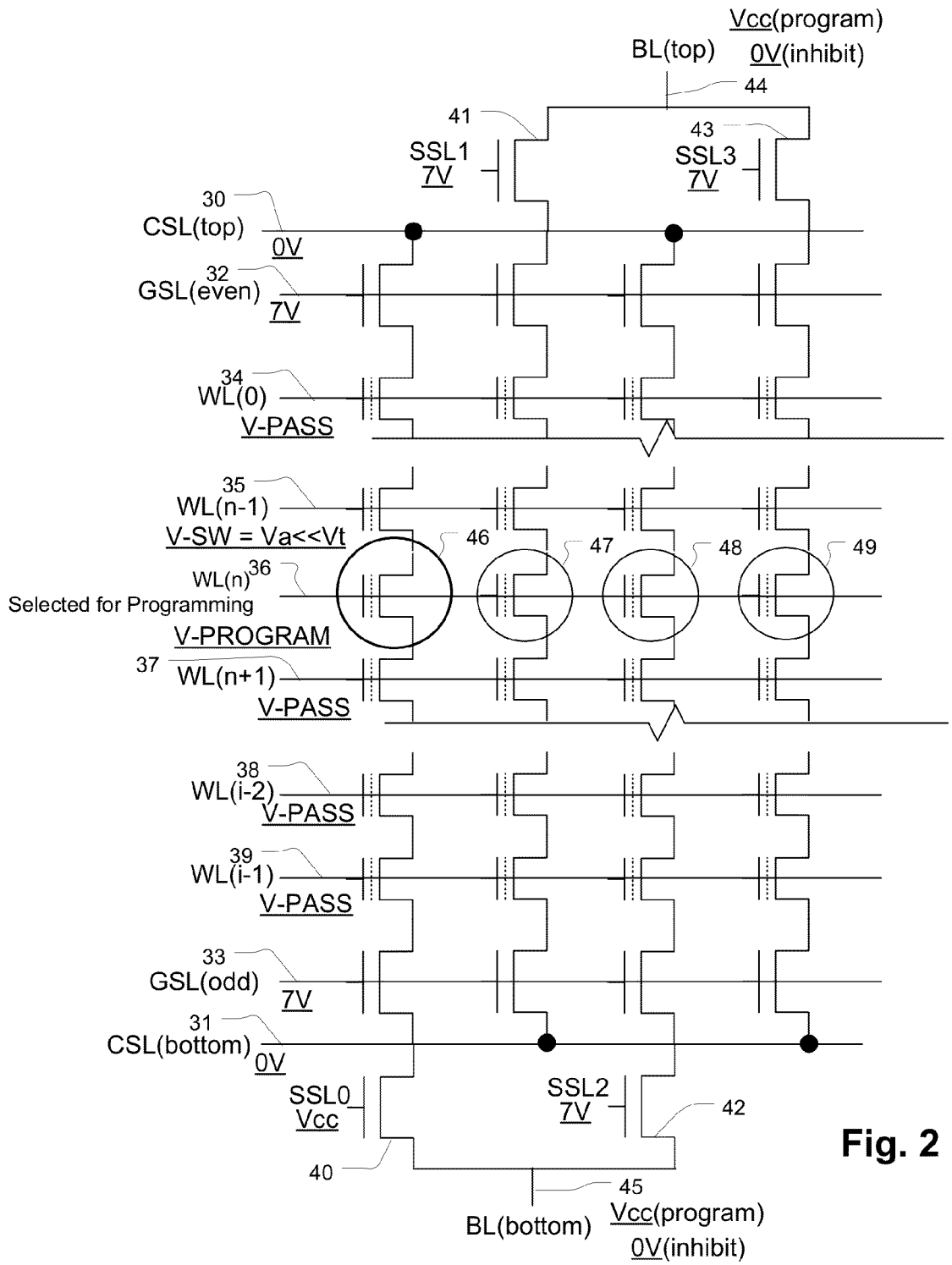
FIG. 2 is a circuit diagram of hot carrier assisted programming via drain-side boosting.

FIG. 2 is a circuit diagram of hot carrier assisted programming via drain-side boosting.

The arrangement of NAND strings controlled by respective SSL transistors, GSL transistors, CSL lines, and bit lines is generally similar to FIG. 1. However, the bias arrangement shown in FIG. 2 performs hot-carrier assisted programming by drain-side boosting. WL(n−1) 35 acts as the assisted gate, and is adjacent to the CSL side of WL(n) 36 which is selected for programming, WL(n−1) 35 receives assist voltage Va<0V, with a time delay until receiving turn-on voltage Vpass. Va gives local boosting between WL(n) 36 to SSL0 and causes additional hot-carrier injection.

The selected WL 36 is programmed by more programming shots under low pass-gate and program voltages. The string select transistor of the selected page (SSL0 40 in this example) is given Vcc, and the string select transistors SSL1 41, SSL2 42, and SSL 43 of unselected pages and GSL(even) 32 and GSL(odd) 33 are given a higher voltage than Vpass, such as 7V.

CSL(top) 30 and CSL(bottom) 31 are at 0V. The selected BL(bottom) 45 is given Vcc, but the unselected BL(top) 44 is given 0V. Program inhibit at unselected pages is less of a concern, due to the relatively low differences of Vpass-to-0V or Vpass-to-Vcc, while the selected WL(n) 36 only applies Vpass. Thus program disturb is suppressed.

Figure 3:
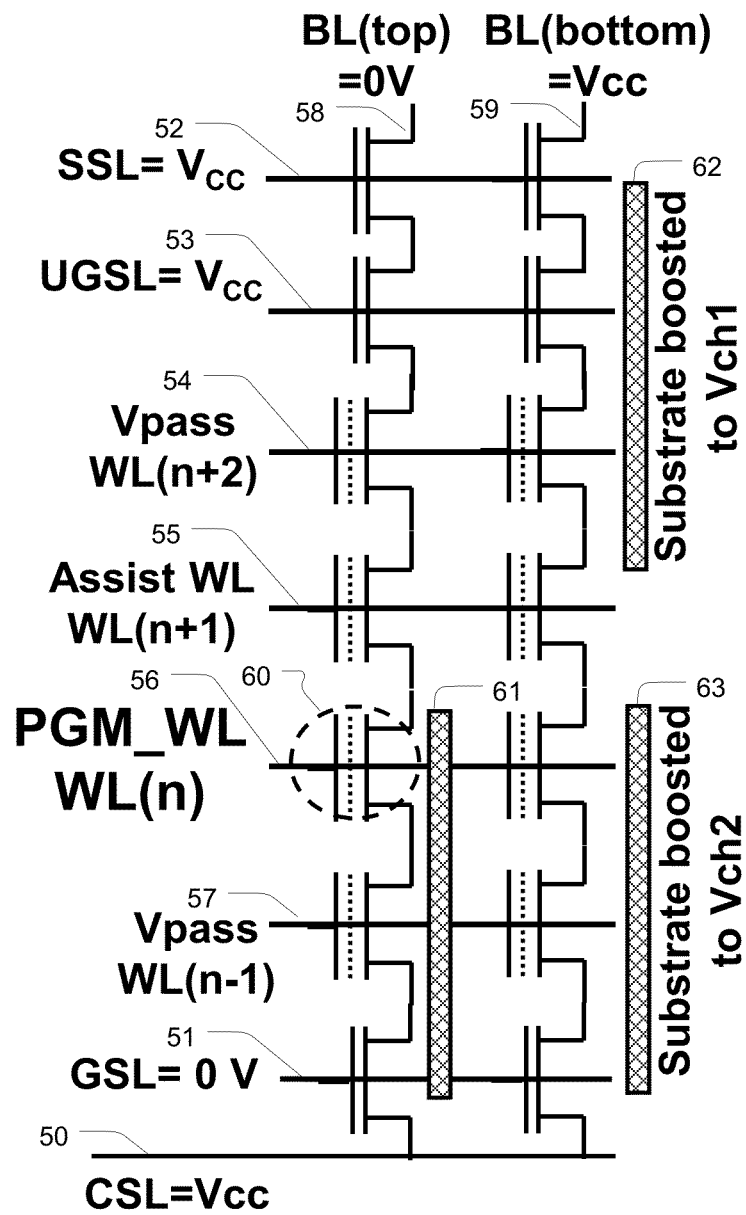
FIG. 3 is a circuit diagram of hot carrier assisted programming via source-side boosting, showing the portions of the body that are boosted.
Figure 4:
FIGS. 4-7 are a set of graphs of voltage versus time for various nodes during hot carrier assisted programming via source-side boosting shown in FIG. 3.
Figure 5:
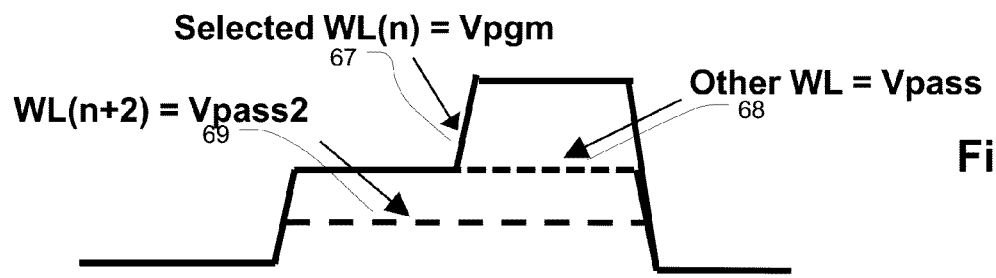
Figure 6:
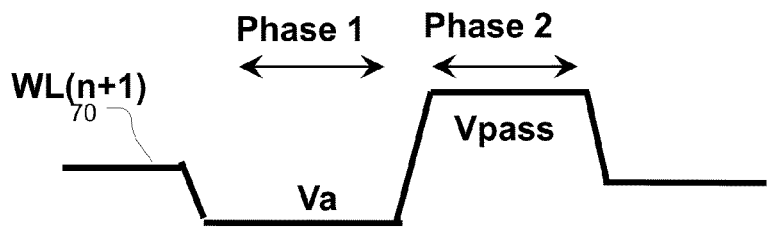
Figure 7:
Figure 8:
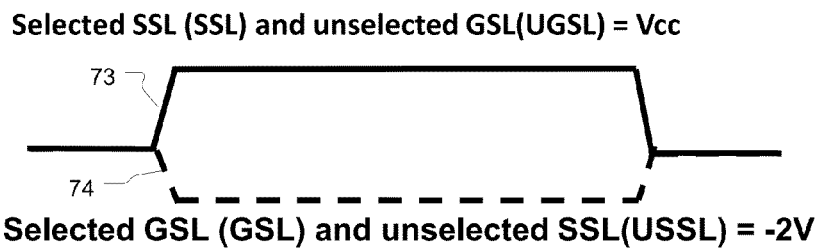
FIGS. 8-11 are an alternate set of graphs of voltage versus time for various nodes during hot carrier assisted programming via source-side boosting shown in FIG. 3.
Figure 9:
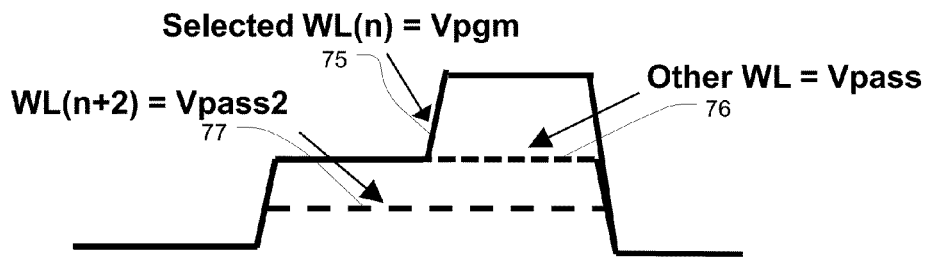
Figure 10:
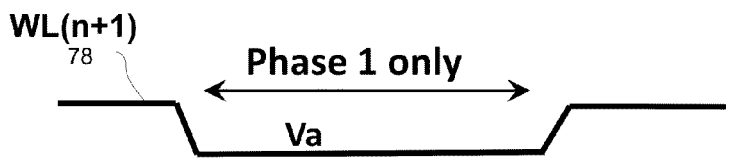
Figure 11:
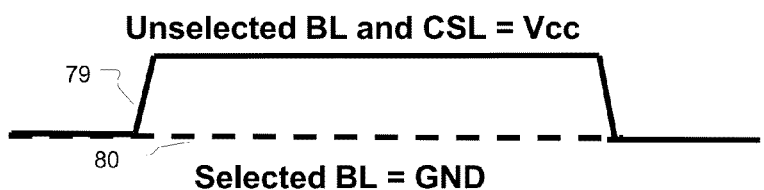

FIG. 3 is a circuit diagram of hot carrier assisted programming via source-side boosting, showing the portions of the channel that are boosted.

A selected NAND string is between bit line BL(top) 58 and common source line CSL 50. A deselected NAND string is between bit line BL(bottom) 59 and common source line CSL 50. The control lines, in order from the bit lines to the common source line, include string select line SSL 52; unselected ground select line UGSL 53; word lines WL(n+2) 54, WL(n+1) 55, WL(n) 56, WL(n−1) 57; and ground select line GSL 51. The selected NAND string has a boosted channel region 61 between GSL 51 and WL(n) 56. The deselected NAND string has two boosted channel regions separated by WL(n+1) 55, including a first boosted channel region 62 between SSL 52 and WL(n+2) 54 and a second boosted channel region 63 between GSL 51 and WL(n) 56. The boosted channel regions are discussed further below.

FIGS. 4-7 are a set of graphs of voltage versus time for various nodes during hot carrier assisted programming via source-side boosting shown in FIG. 3.

In this example, hot-carrier and FN programming are both performed, over multiple phases.

Phase 1 features hot-carrier generation.

Phase 2 features FN programming and hot-carrier programming.

Selected SSL and unselected GSL are shown by trace 65, which can change from ground to Vcc, and return to ground. Alternative voltages can be used.

Unselected SSL and selected GSL are shown by trace 66, which can change from ground to −2V, and return to ground. Unselected BL and CSL are shown by trace 71, which can change from ground to Vcc, and return to ground. Alternative voltages can be used.

Selected BL are shown by trace 72 GND. Alternative voltages can be used.

WL(n+1) 70 receives the assist voltage. WL(n+2) 69 receives a lower voltage than Vpass to suppress hot-carrier disturb. The two phases are described in further detail as follows.

(a) Phase 1, hot-carrier generation.

WL(n+1) 70 is turned off with negative assist voltage Va, and WL(n+2) 69 is turned on with pass voltage Vpass2, and other word lines 68 and WL(n) 67 are turned on with pass voltage Vpass, where Vpass2<Vpass. WL(n+1) 70 cuts off the body in the strip into two body regions, GSL-to-WL(n) and SSL-to-WL(n+2). The different body regions vary depending on the particular NAND string, as follows.

Selected Page or BL:

The channel between GSL and WL(n) is locally boosted to Vch2, but the other side SSL-to-WL(n+2) is kept at 0V. The lateral electric field is Vch2. Hot carriers are generated and injected into WL(n) for hot-carrier programming.

Unselected Page or BLs:

BL channels are fully turned off, and boosted to Vch1 or Vch2 for program inhibit while Vpass is turned on.

(b) Phase 2: FN programming and hot-carrier programming.

WL(n+1) 70 is turned on by Vpass, where Vpass2<Vpass, WL(n) 67 receives program bias, and the biases of other word lines remain unchanged. Again, the different body regions vary depending on the particular NAND string, as follows.

Selected Page or BL:

Selected page is turned on by Vcc and selected BL receives GND. WL(n+1) 70 turned on by Vpass causing hot-carrier programming, while Vpgm on WL(n) 67 results in FN programming.

Unselected Page or BLs:

Unselected pages are turned off by −2V and unselected BL receives Vcc for self boosting. Thus channels have Vch channel potential. Program inhibit results from the boosted Vch channel potential.

FIGS. 8-11 are an alternate set of graphs of voltage versus time for various nodes during hot carrier generation and programming via source-side boosting shown in FIG. 3.

FIGS. 8-11 are similar to FIGS. 4-7, except that WL(n+1) 78 is biased by only Va and not Vpass. Accordingly, Phase 1 occurs over a longer pulsing width in which hot-carrier generation and hot-carrier generation and programming occurs, but Phase 2 with FN programming does not occur.

Figure 12:
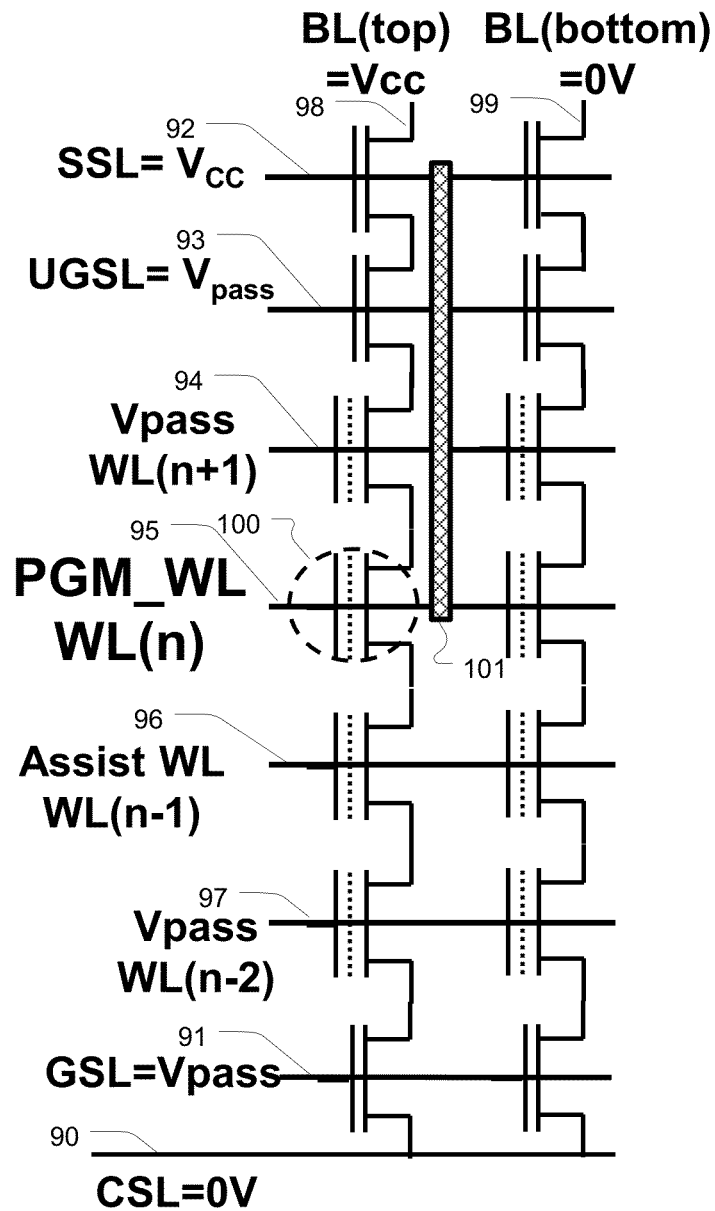
FIG. 12 is a circuit diagram of hot carrier assisted programming via drain-side boosting, showing the portions of the body that are boosted.
Figure 13:
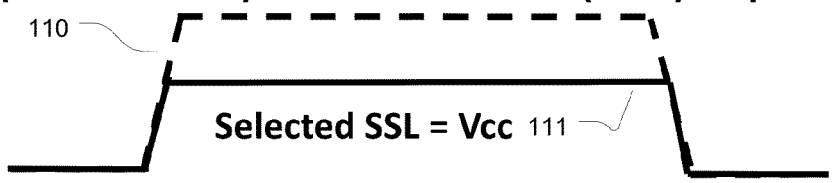
FIGS. 13-16 are a set of graphs of voltage versus time for various nodes during hot carrier assisted programming via drain-side boosting shown in FIG. 12.
Figure 14:
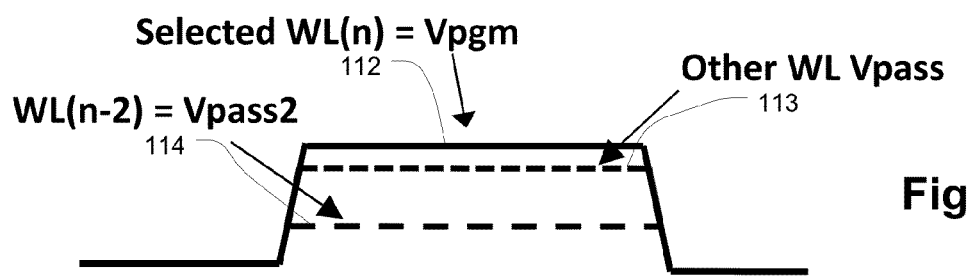
Figure 15:
Figure 16:
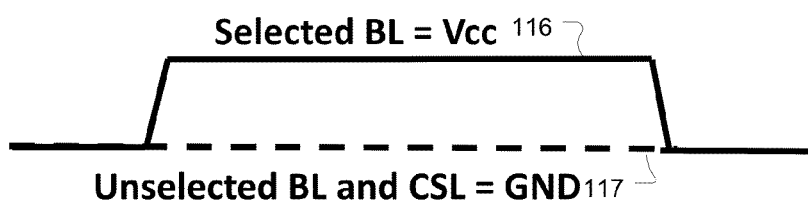

FIG. 12 is a circuit diagram of hot carrier generation and programming via drain-side boosting, showing the portions of the channels that are boosted.

A selected NAND string is between bit line BL(top) 98 and common source line CSL 90. A deselected NAND string is between bit line BL(bottom) 99 and common source line CSL 90. The control lines, in order from the bit lines to the common source line, include string select line SSL 92; unselected ground select line UGSL 93; word lines WL(n+1) 94, WL(n) 95, WL(n−1) 96; WL(n−2) 97; and ground select line GSL 91.

The selected NAND string has a boosted channel region 101 between SSL 92 and WL(n) 95. The deselected NAND string has no boosted channel regions. The boosted channel region is discussed further below.

FIGS. 13-16 are a set of graphs of voltage versus time for various nodes during hot carrier generation and programming via drain-side boosting shown in FIG. 12.

In this example, FN programming does not occur.

WL(n−1) 115 receives the assist voltage. WL(n−2) 114 receives a lower voltage than Vpass to suppress program disturb from hot-carrier generation and programming.

Unlike source-side boosting, the string select transistors of unselected pages and GSL, shown by trace 110, receive higher voltage than Vcc. Thus the BL voltage can be passed through the body without the body undergoing self-boosting. String select transistors of selected pages, shown by trace 111, receive Vcc. Alternative voltages can be used.

The selected BL 116 receives Vcc, and the other, deselected BLs and CSL, shown by trace 117, receive 0V. Alternative voltages can be used.

WL(n−1) 115 is turned off with the assist voltage Va for a time interval until receiving a Vpass turn on voltage. WL(n−1) 115 cuts off the body I n the strip into two body regions, GSL-to-WL(n−2) and SSL-to-WL(n). The different regions vary depending on the particular NAND string, as follows.

Selected Page or BL:

The channel between SSL-to-WL(n) is locally boosted to Vch, but the other side GSL-to-WL(n−2) is kept 0V. The lateral electric field is Vch2. Hot carriers are generated and injected into WL(n) 112 for hot-carrier programming.

Unselected Page or BLs:

The whole body region is 0V without self-boosting. The memory cells subject to program disturb undergo a Vpgm-to-0V FN disturb. Accordingly, in some cases the program algorithms is characterized by more program shots with low program voltage, rather than few program shots with an ISPP (incremental step pulse program voltage).

Figure 17:
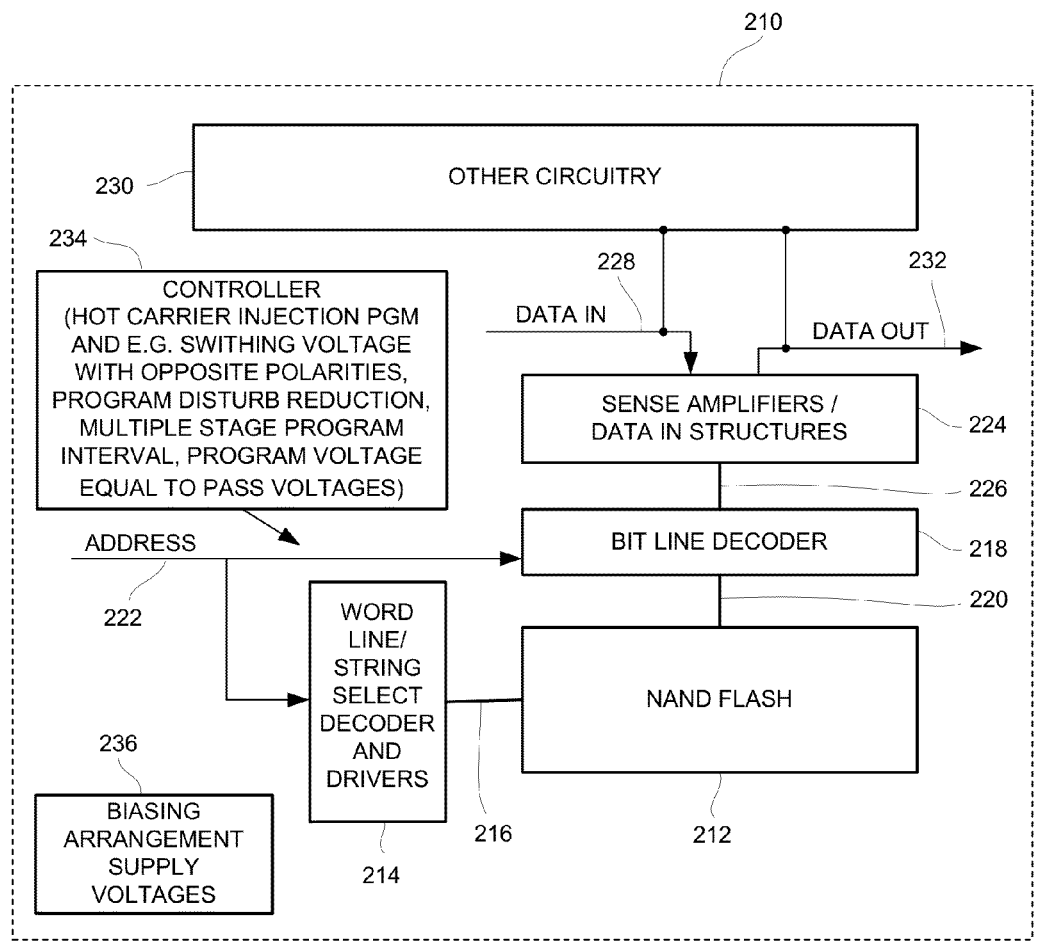
FIG. 17 is a block diagram of an integrated circuit memory employing memory cells and bias circuitry according to embodiments of the present invention.

FIG. 17 is a simplified block diagram of an integrated circuit employing boosted virtual drain, hot carrier injection programmed NAND flash as described herein. The integrated circuit 210 includes a memory array 212 implemented using charge trapping memory cells or floating gate memory cells, for example, on a semiconductor strip. A word line (or row) and string select decoder 214 (including appropriate drivers) are coupled to, and in electrical communication with, a plurality 216 of word lines, string select lines and ground select lines, arranged along rows in the memory array 212. A bit line (column) decoder and drivers 218 are coupled to and in electrical communication with a plurality of bit lines 220 arranged along columns in the memory array 212 for reading data from, and writing data to, the memory cells in the memory array 212. Addresses are supplied on bus 222 to the word line decoder and string select decoder 214 and to the bit line decoder 218. Sense amplifiers and data-in structures in block 224, including current sources for the read, program and erase modes, are coupled to the bit line decoder 218 via data bus 226. Data is supplied via the data-in line 228 from input/output ports on the integrated circuit 210 or from other data sources internal or external to the integrated circuit 210, to the data-in structures in block 224. In the illustrated embodiment, other circuitry 230 is included on the integrated circuit 210, such as a general purpose processor or special purpose application circuitry, or a combination of modules providing system-on-a-chip functionality supported by the memory cell array. Data is supplied via the data-out line 232 from the sense amplifiers in block 224 to input/output ports on the integrated circuit 210, or to other data destinations internal or external to the integrated circuit 210.

A controller 234 implemented in this example, using bias arrangement state machine, controls the application of bias arrangement supply voltages and current sources 236, such as read, program, erase, erase verify, program verify voltages or currents for the word lines and bit lines, and controls the word line/source line operation using an access control process. The controller implements hot carrier programming as described herein, and for example, switching voltage with opposite polarities, program disturb reduction, multiple stage program intervals, and program voltages equal to pass voltages. The controller 234 can be implemented using special purpose logic circuitry as known in the art. In alternative embodiments, the controller 234 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 234.

FIGS. 18-25 are graphs characterizing aspects of the memory cells according to embodiments of the present invention.

Figure 18:
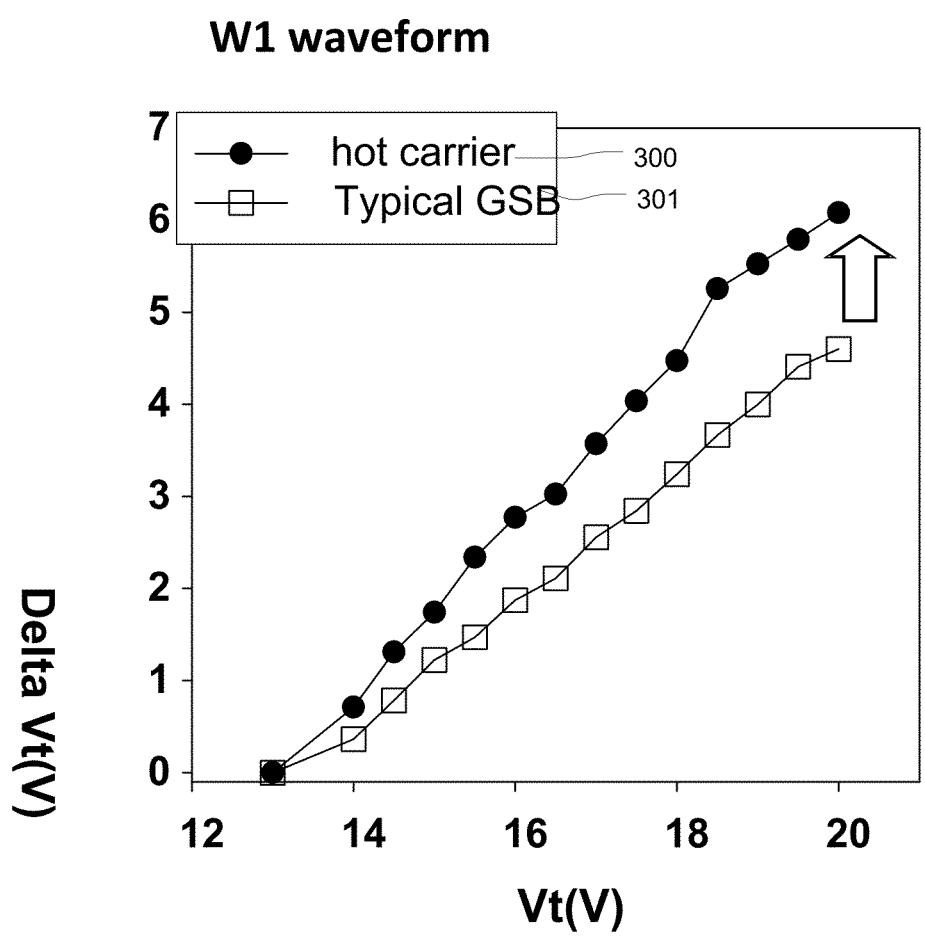
FIGS. 18-25 are graphs characterizing aspects of the memory cells according to embodiments of the present invention.
Figure 19:
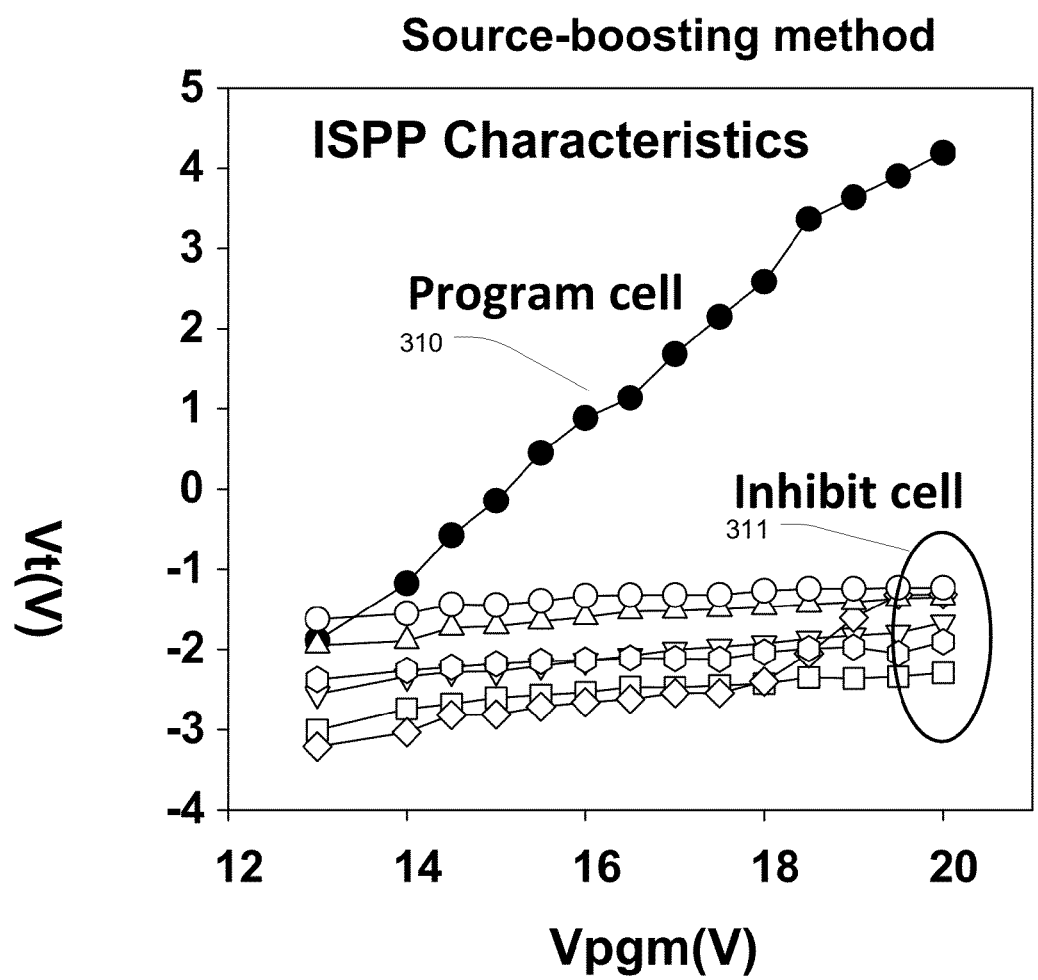

FIGS. 18 and 19 show that the ISPP slope 300—for example with the hot carrier generation and programming as shown in FIGS. 4-7—is much better than typical GSB programming 301. Faster program speed is attributable to hot-carrier generation and programming 310, and superior program inhibition 311 like the GSB method is observed.

Figure 20:
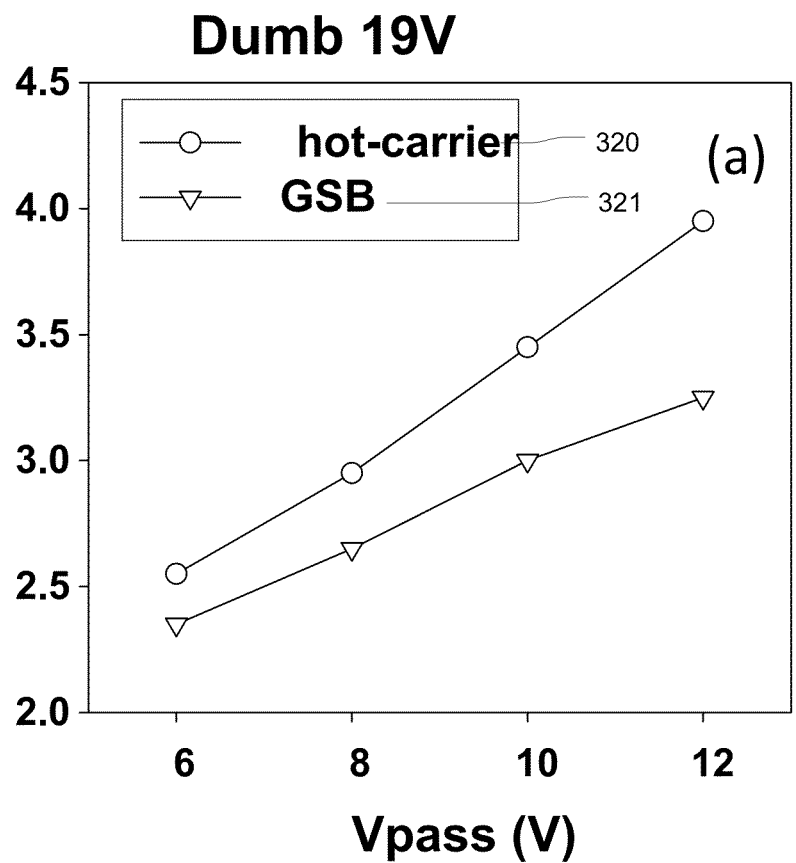
Figure 21:
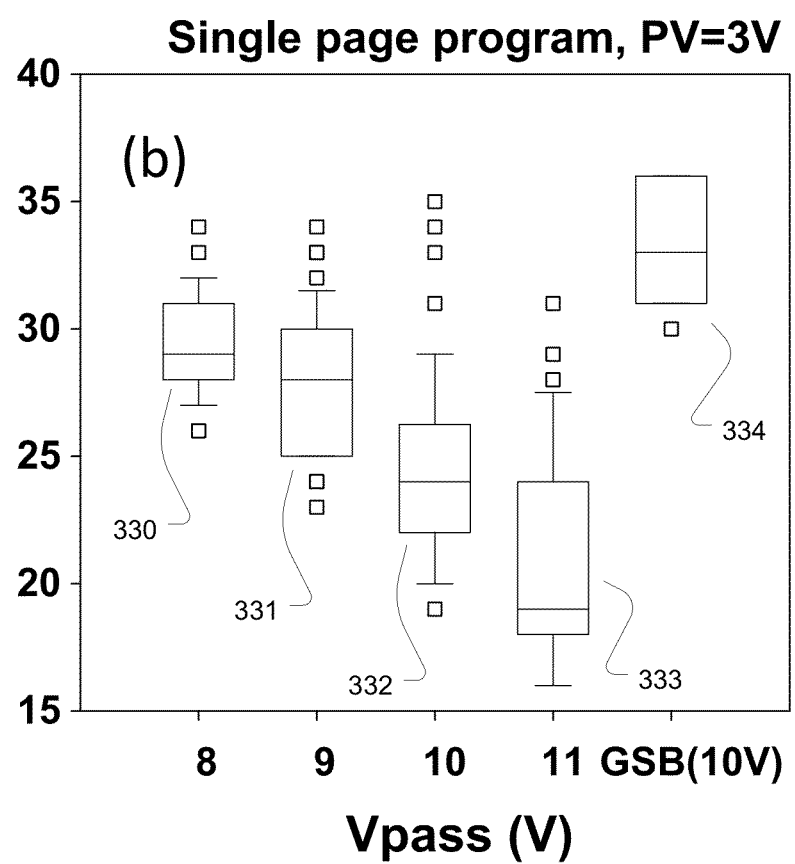

FIGS. 20 and 21 show that a higher Vpass results in a higher boosting channel potential and further enhance hot-carrier programming 320—for example with the hot carrier generation and programming as shown in FIGS. 4-7—in comparison to GSB programming 321. The larger lateral electric field enhances the hot-carrier generation and program speed. For a given program verify, hot-carrier generation and programming requires fewer program shots or maximum program bias, as Vpass is increased. Vpass is shown as 8 V 330, 9V 331, 10V 332, 11V 333, and GSB programming at 10V 334.

Figure 22:
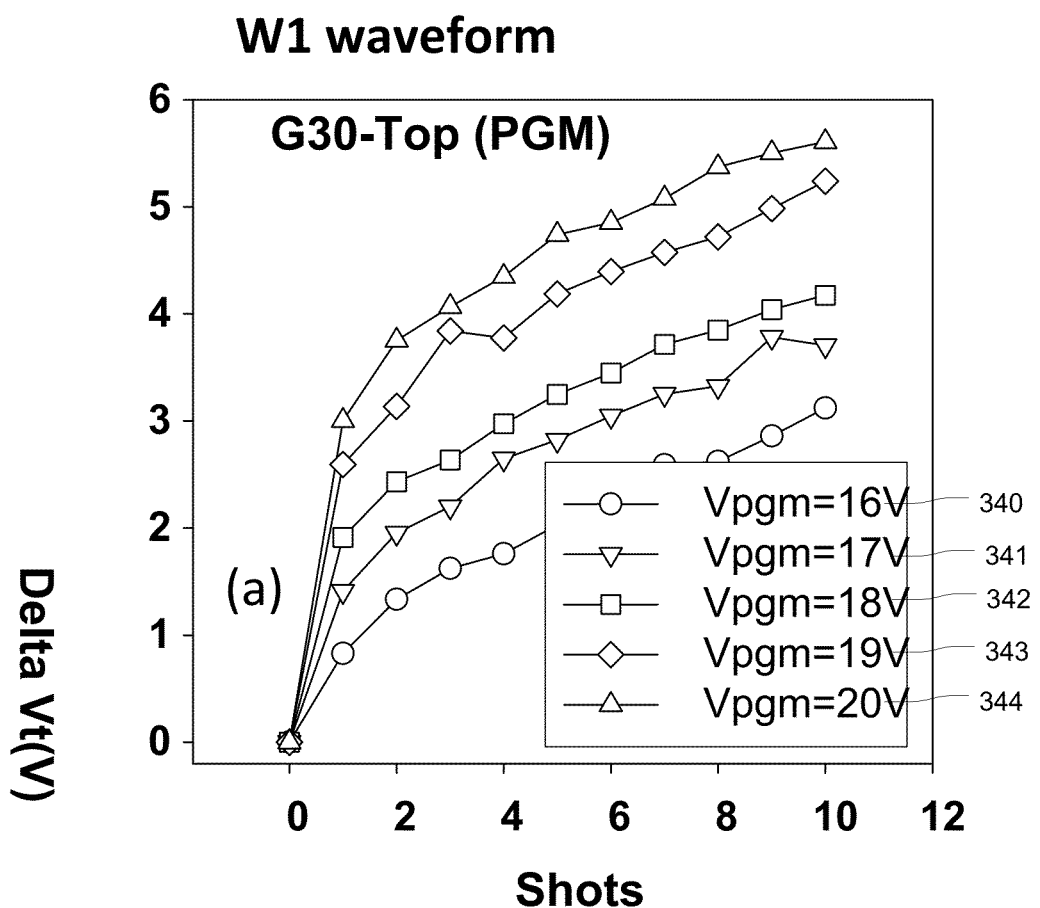
Figure 23:
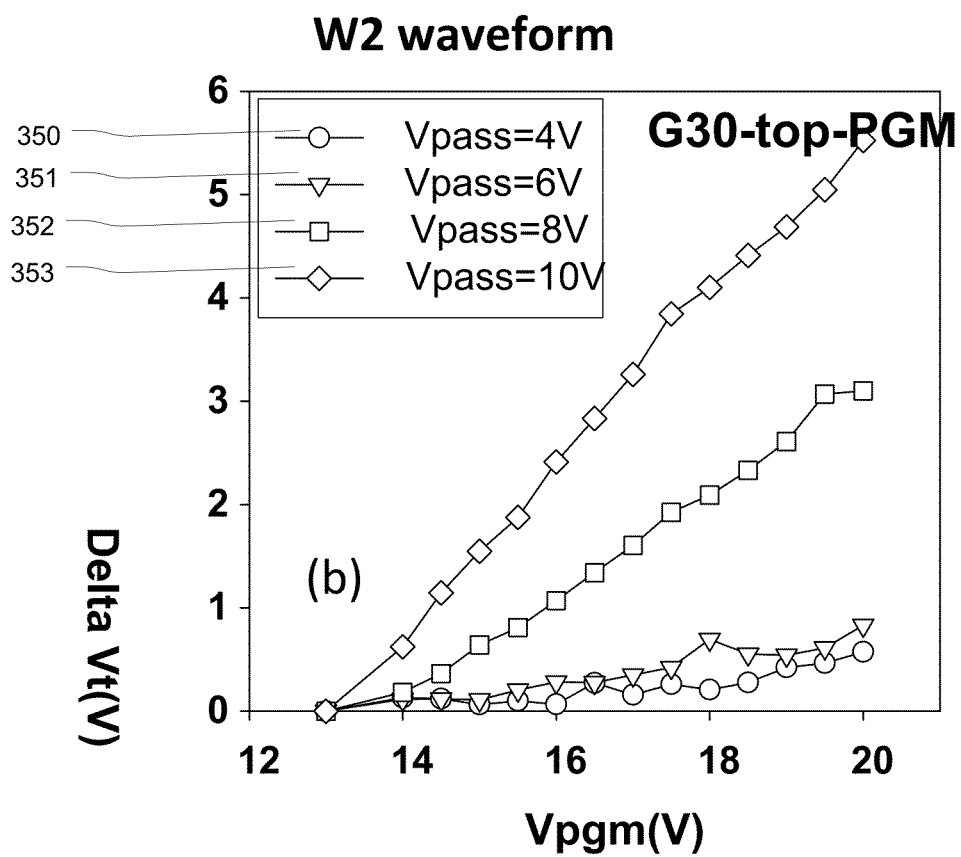

FIGS. 22 and 23 shows that more programming shots are helpful for programming. FIG. 22 shows that with the hot carrier generation and programming as shown in FIGS. 4-7, a reduction in Vpgm results in more program shots to obtain a particular change in threshold voltage. Shown are Vpgm of 16V 340, 17V 341, 18V 342, 19V 343, and 20V 344. FIG. 23 shows that with the hot carrier generation and programming as shown in FIGS. 8-11 (with the only phase 1 performing hot carrier generation and programming applying a longer pulsing width but not FN programming), faster program speed is observed, evidencing the excellent boosting potential for 3D devices. Shown are Vpass of 4V 350, 6V 351, 8V 352, and 10V 353.

Figure 24:
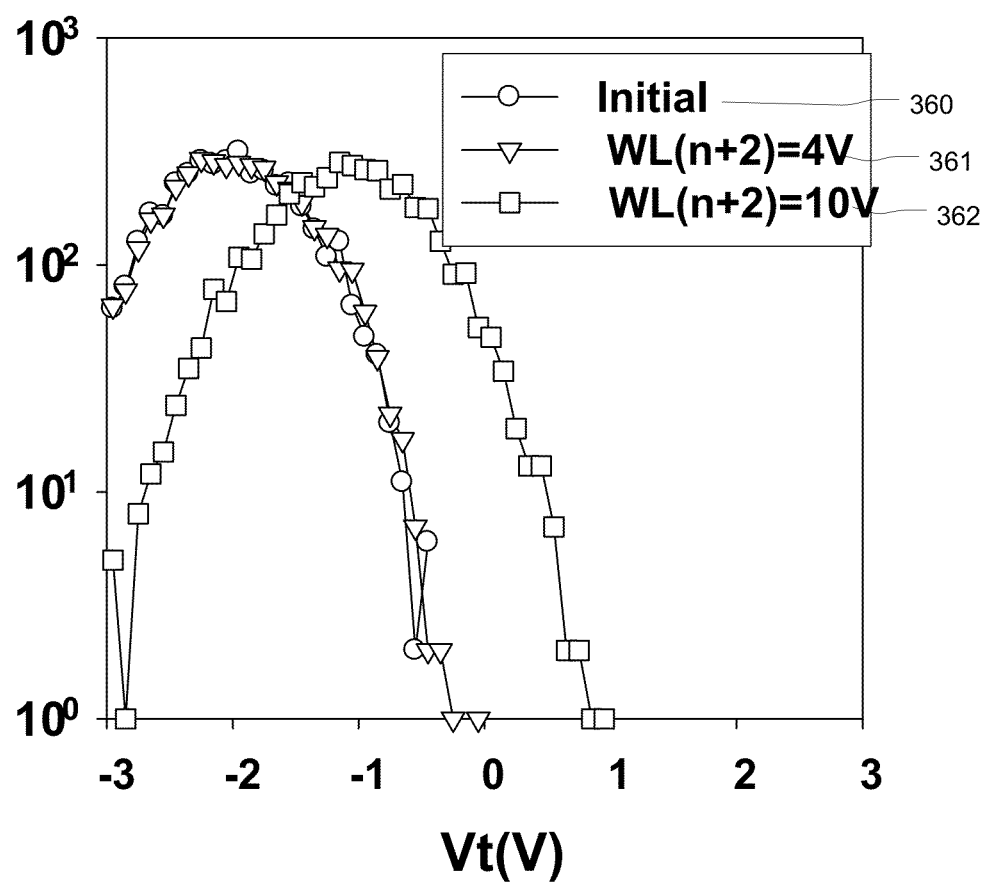

FIG. 24 shows that lower voltage on WL(n+2) greatly reduces the unexpected hot-carrier program disturb, with Vt distributions for initial Vt 360, WL(n+2)=4V 361, and WL(n+2)=10V 362.

Figure 25:
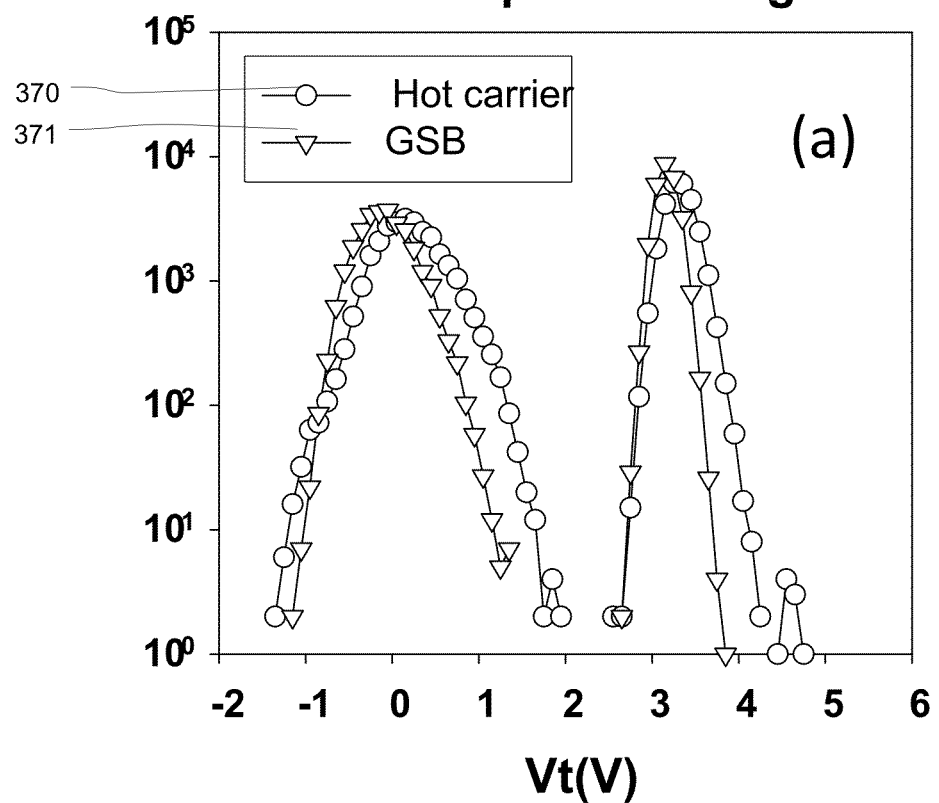

FIG. 25 shows that program disturb for the source-side boosting programming method is worse than typical GSB, with Vt distributions for hot carrier programming 370, and GSB programming 371. Hot carrier programming 370 is shifted to the right in contrast with GSB programming 371.

FIG. 26 is a circuit diagram of hot carrier generation and programming via source-side boosting, showing the portions of the channels that are boosted, with reduced program disturb. An additional WL receiving Vpass4 is between the program WL and the assist WL.

A selected NAND string is between bit line BL(top) 128 and common source line CSL 120. The control lines, in order from the bit line to the common source line, include string select line SSL 122; unselected ground select line UGSL 123; word lines WL(n+2) 124, WL(n+1) 125, WL(n) 126, WL(n−1) 127; and ground select line GSL 121. The selected NAND string has a boosted channel region 131 between GSL 121 and WL(n+1) 125. WL(n+1) 123 receives a Vpass4 voltage, in between the WL(n+2) 123 receiving an assist voltage and WL(n) 126 receiving a program voltage.

FIG. 27 shows that the hot carrier generation and programming as shown in FIGS. 4-7 modified with a higher Vpass4 improves disturb and achieves a better disturb-free window. Shown are Vpass4=0V 380, Vpass4=4V 381, Vpass4=8V 382; and GSB programming 383.

Figure 28:
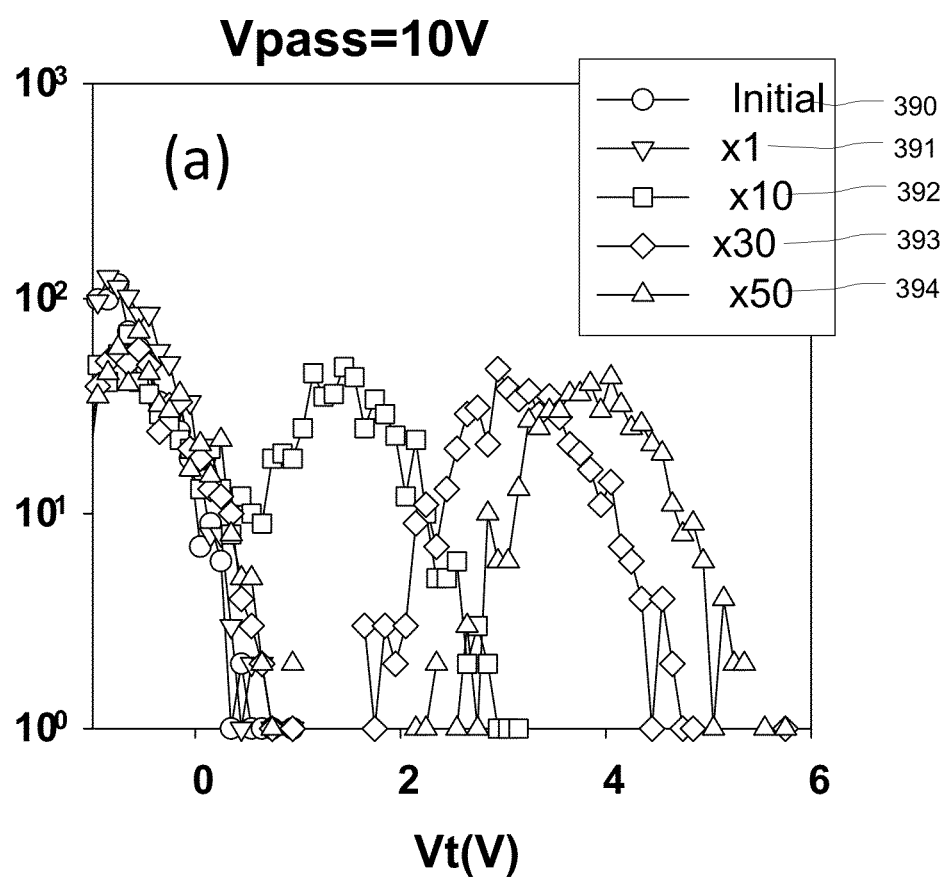
Figure 29:
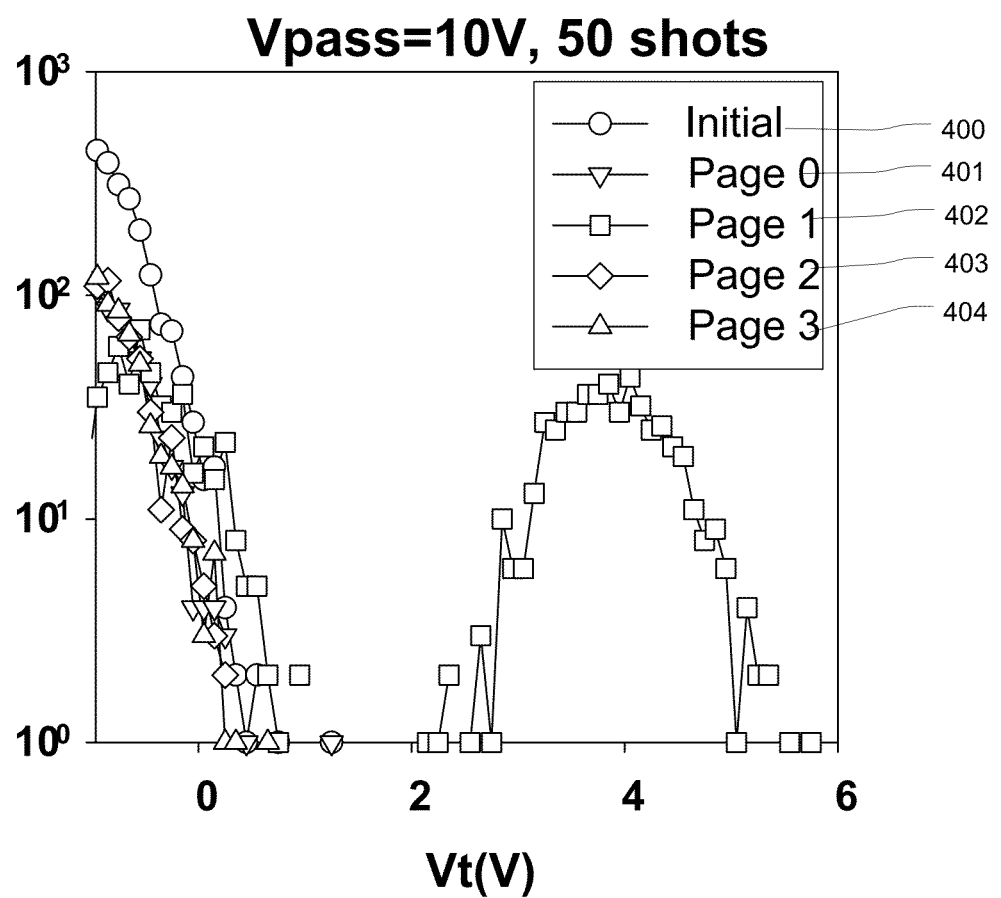
Figure 30:
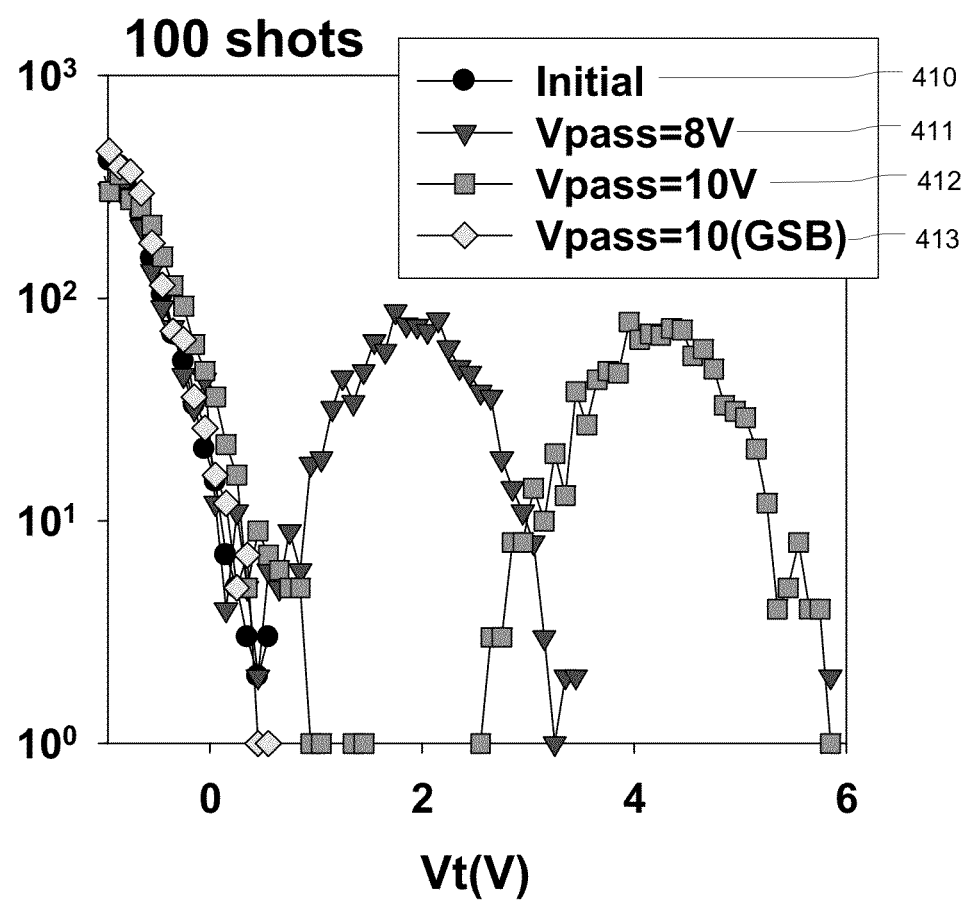

FIGS. 28-30 show the results of the drain-side boosting programming method. The program voltage on the selected word line is equal to the pass-gate voltage of other, unselected word lines. More programming shots achieve higher program Vt, in contrast with an ISPP programming scheme. FIG. 28 shows Vt distributions after varying shots and Vpass=10V, including initial Vt distribution 390, 1 shot 391, 10 shots 392, 30 shots 393, and 50 shots 394. FIG. 29 shows Vt distributions of initial page 400, and different pages after 50 shots with Vpass=50V. Unselected pages 401, 403, and 404 suffer Vpgm-to-0 program stress. Page 1 402 is programmed, and unselected pages 401, 403, and 404 are almost disturb free. FIG. 30 shows Vt distributions of initial page 410, and different pages after 100 shots. A higher Vpass achieves better hot-carrier programming, shown by Vpass=8V 411, and Vpass=10V 412. GSB with Vpass=10V 413 is not workable for programming.

Figure 31:
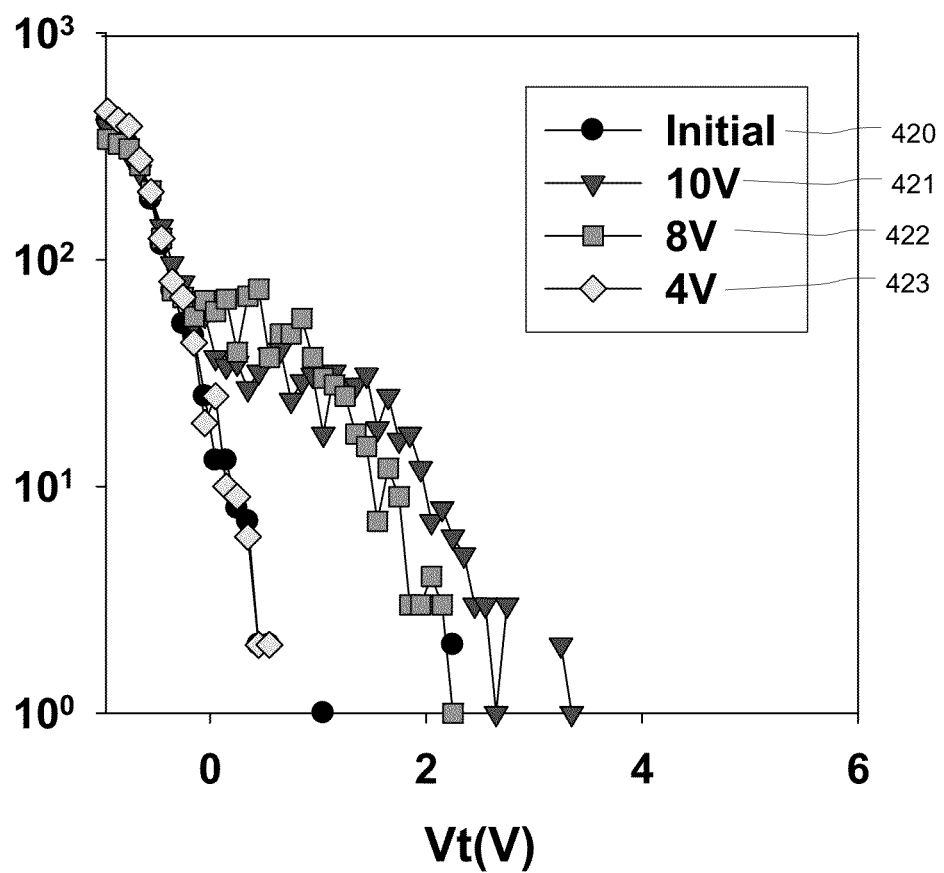

FIG. 31 shows that a lower voltage on WL(n−2) greatly reduces program disturb. Shown are Vt distributions including initial Vt distribution 420, WL(n−2)=10V 421, WL(n−2)=8V 422, and WL(n−2)=4V.

Figure 32:
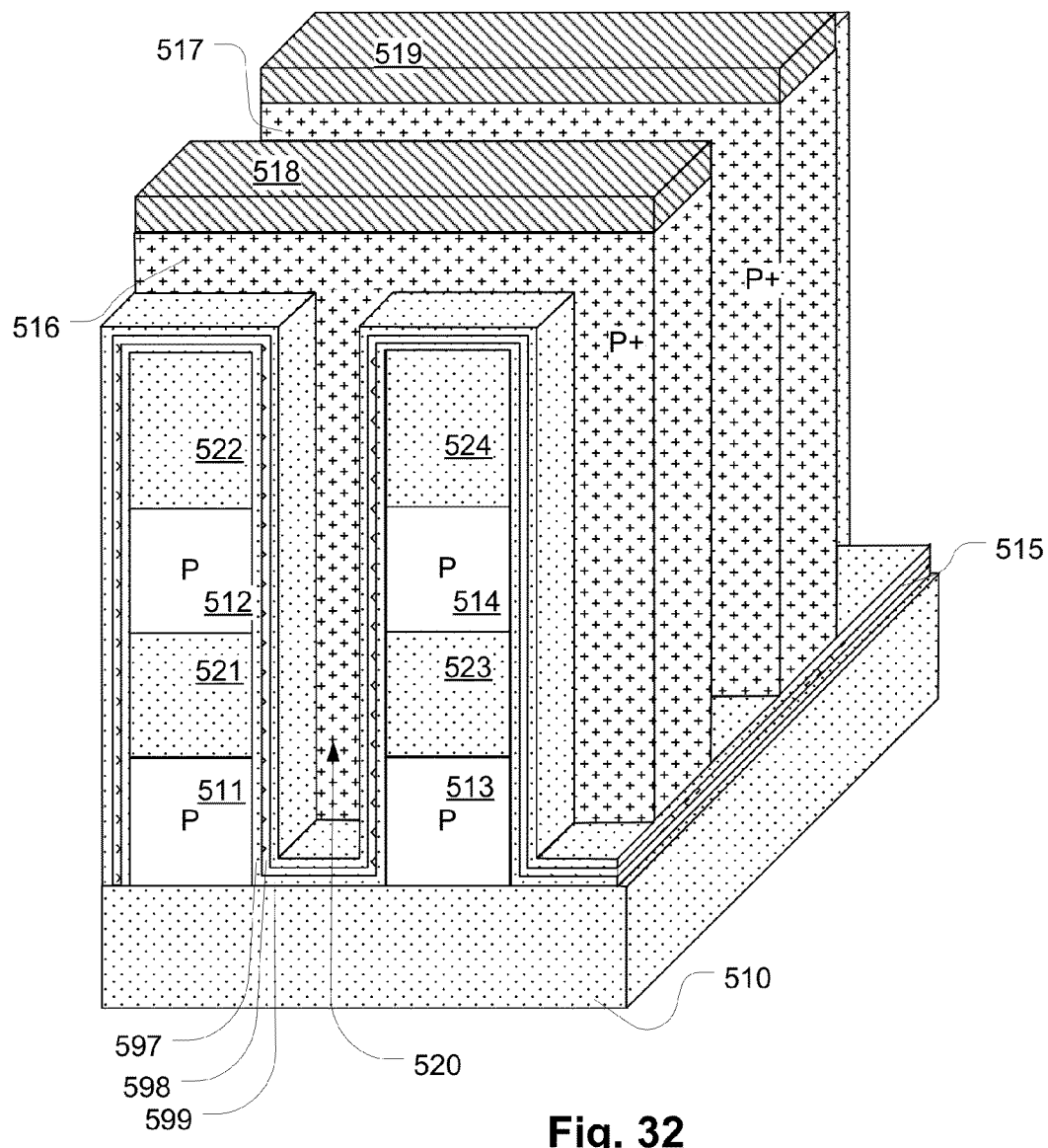
FIG. 32 is a perspective drawing of a 2×2 portion of a three-dimensional array of multigate memory cells.

FIG. 32 is a perspective drawing of a 2×2 portion of a three-dimensional charge trapping memory array with fill material removed from the drawing to give a view of the stacks of semiconductor strips and orthogonal word lines that make up the 3D array. The multigate memory cells are biased for hot carrier programming as shown herein. In this illustration, only 2 layers are shown. However, the number of layers can be extended to very large numbers. The memory array is formed on an integrated circuit substrate having an insulating layer 510 over underlying semiconductor or other structures (not shown). The memory array includes a plurality of stacks (2 are shown in the drawing) of semiconductor strips 511, 512, 513, 514 separated by insulating material 521, 522, 523, 524. The stacks are ridge-shaped extending on the Y-axis as illustrated in the figure, so that the semiconductor strips 511-514 can be configured as memory cell strings. Semiconductor strips 511 and 513 can act as memory cell strings in a first memory plane. Semiconductor strips 512 and 514 can act as memory cell strings in a second memory plane.

The insulating material 521 between the semiconductor strips 511 and 512 in a first stack and the insulating material 523 between semiconductor strips 513 and 514 in the second stack has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers.

A layer 515 of memory material, such as a dielectric charge trapping structure, coats the plurality of stacks of semiconductor strips in this example. A plurality of word lines 516, 517 is arranged orthogonally over the plurality of stacks of semiconductor strips. The word lines 516, 517 have surfaces conformal with the plurality of stacks of semiconductor strips, filling the trenches (e.g. 520) defined by the plurality of stacks, and defining a multi-layer array of interface regions at cross-points between side surfaces of the semiconductor strips 511-514 on the stacks and word lines 516, 517. A layer of silicide (e.g. tungsten silicide, cobalt silicide, titanium silicide) 518, 519 can be formed over the top surfaces of the word lines 516, 517.

As a result, a 3D array of SONOS-type memory cells configured in a NAND flash array can formed. The source, drain and channel are formed in the silicon (S) semiconductor strips 511-514, the layer 515 of the memory material includes a tunneling dielectric layer 597 which can be formed of silicon oxide (O), a charge storage layer 598 which can be formed of silicon nitride (N), a blocking dielectric layer 599 which can be formed of silicon oxide (O), and the gate comprises polysilicon (S) of the word lines 516, 517.

The multigate memory cells have gates on opposing side of the semiconductor strips 511-514. In this case, the multiple gates on a particular memory cell are controlled by the same word line, such as word line 516 or 517.

Figure 33:
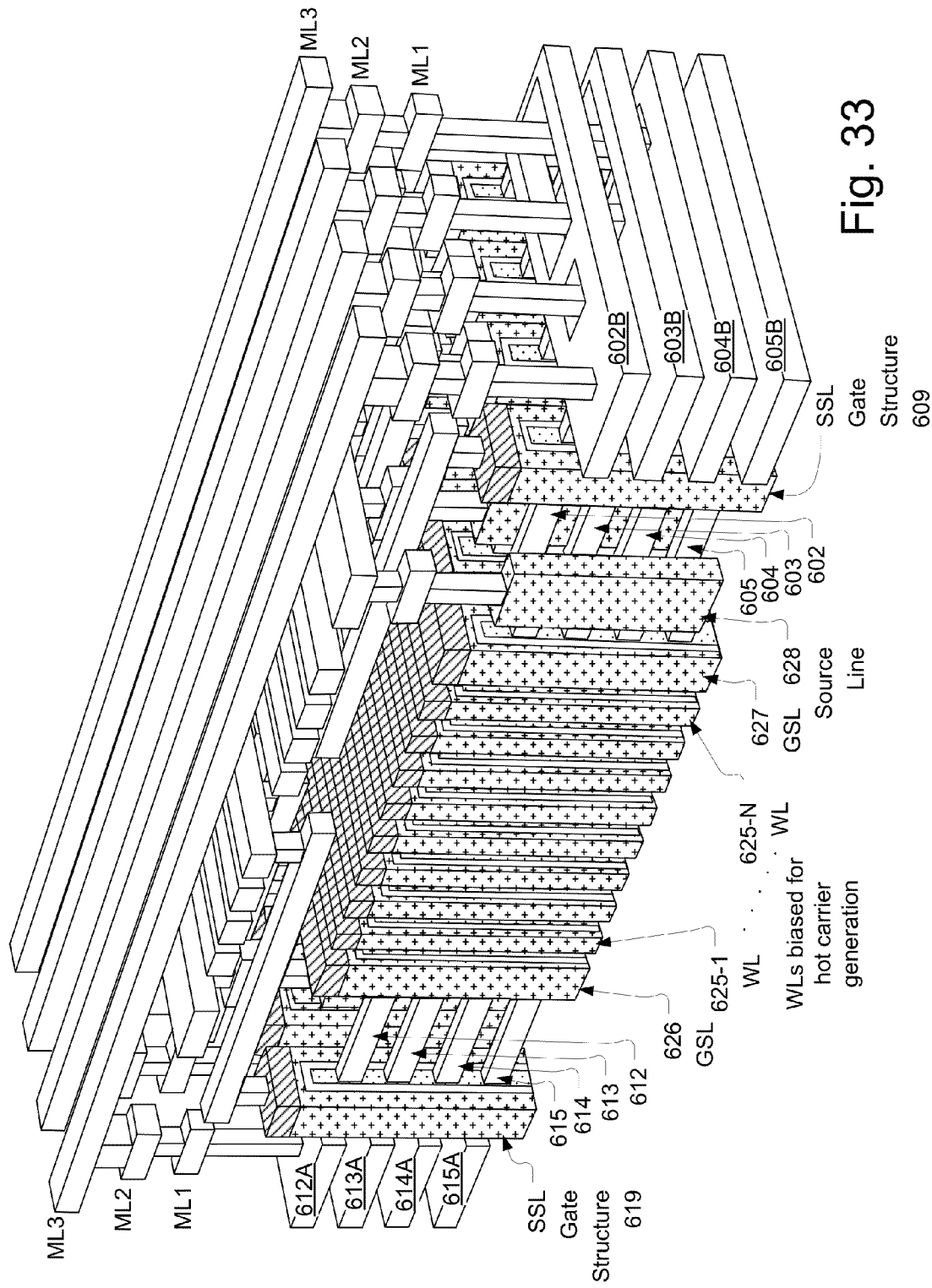
FIG. 33 is a perspective view of a 3D array of memory cells biased to perform hot carrier generation and programming.

FIG. 33 is a perspective view of a 3D array of memory cells biased to perform hot carrier generation and programming. Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of word lines 625-1, . . . , 625-n−1, 625-n conformal with the plurality of ridge-shaped stacks, and which act as word lines WLn, WLn−1, . . . WL1. The plurality of ridge-shaped stacks includes semiconductor strips 612, 613, 614, 615. Semiconductor strips in the same plane are electrically coupled together by stairstep structures.

The shown word line numbering, ascending from 1 to N going from the back to the front of the overall structure, applies to even memory pages. For odd memory pages, the word line numbering descends from N to 1 going from the back to the front of the overall structure. The word lines are biased for hot carrier generation as discussed herein.

Stairstep structures 612A, 613A, 614A, 615A terminate semiconductor strips, such as semiconductor strips 612, 613, 614, 615. As illustrated, these stairstep structures 612A, 613A, 614A, 615A are electrically connected to different bit lines for connection to decoding circuitry to select planes within the array. These stairstep structures 612A, 613A, 614A, 615A can be patterned at the same time that the plurality of ridge-shaped stacks are defined.

Stairstep structures 602B, 603B, 604B, 605B terminate semiconductor strips, such as semiconductor strips 602, 603, 604, 605. As illustrated, these stairstep structures 602B, 603B, 604B, 605B are electrically connected to different bit lines for connection to decoding circuitry to select planes within the array. These stairstep structures 602B, 603B, 604B, 605B can be patterned at the same time that the plurality of ridge-shaped stacks are defined.

Any given stack of semiconductor strips is coupled to either the stairstep structures 612A, 613A, 614A, 615A, or the stairstep structures 602B, 603B, 604B, 605B, but not both. A stack of semiconductor strips has one of the two opposite orientations of bit line end-to-source line end orientation, or source line end-to-bit line end orientation. For example, the stack of semiconductor strips 612, 613, 614, 615 has bit line end-to-source line end orientation; and the stack of semiconductor strips 602, 603, 604, 605 has source line end-to-bit line end orientation.

The stack of semiconductor strips 612, 613, 614, 615 is terminated at one end by the stairstep structures 612A, 613A, 614A, 615A, passes through SSL gate structure 619, gate select line GSL 626, word lines 625-1 WL through 625-N WL, gate select line GSL 627, and terminated at the other end by source line 628. The stack of semiconductor strips 612, 613, 614, 615 does not reach the stairstep structures 602B, 603B, 604B, 605B.

The stack of semiconductor strips 602, 603, 604, 605 is terminated at one end by the stairstep structures 602B, 603B, 604B, 605B, passes through SSL gate structure 609, gate select line GSL 627, word lines 625-N WL through 625-1 WL, gate select line GSL 626, and terminated at the other end by a source line (obscured by other parts of figure). The stack of semiconductor strips 602, 603, 604, 605 does not reach the stairstep structures 612A, 613A, 614A, 615A.

A layer of memory material separates the word lines 625-1 through 625-n, from the semiconductor strips 612-615 and 602-605 as described in detail in prior figures. Ground select lines GSL 626 and GSL 627 are conformal with the plurality of ridge-shaped stacks, similar to the word lines.

Every stack of semiconductor strips is terminated at one end by stairstep structures, and at the other end by a source line. For example, the stack of semiconductor strips 612, 613, 614, 615 is terminated at one end by stairstep structures 612A, 613A, 614A, 615A, and terminated on the other end by source line 628. At the near end of the figure, every other stack of semiconductor strips is terminated by the stairstep structures 602B, 603B, 604B, 605B; and every other stack of semiconductor strips is terminated by a separate source line. At the far end of the figure, every other stack of semiconductor strips is terminated by the stairstep structures 612A, 613A, 614A, 615A; and every other stack of semiconductor strips is terminated by a separate source line.

Bit lines and string select lines are formed at the metals layers ML1, ML2, and ML3; and are discussed in further figures below with better visibility.

Transistors are formed between the stairstep structures 612A, 613A, 614A and the word line 625-1. In the transistors, the semiconductor strip (e.g. 613) acts as the channel region of the device. SSL gate structures (e.g. 619, 609) are patterned during the same step that the word lines 625-1 through 625-n are defined. A layer of silicide 626 can be formed along the top surface of the word lines, the ground select lines, and over the gate structures. The layer of memory material can act as the gate dielectric for the transistors. These transistors act as string select gates coupled to decoding circuitry for selecting particular ridge-shaped stacks in the array.

Figure 34:
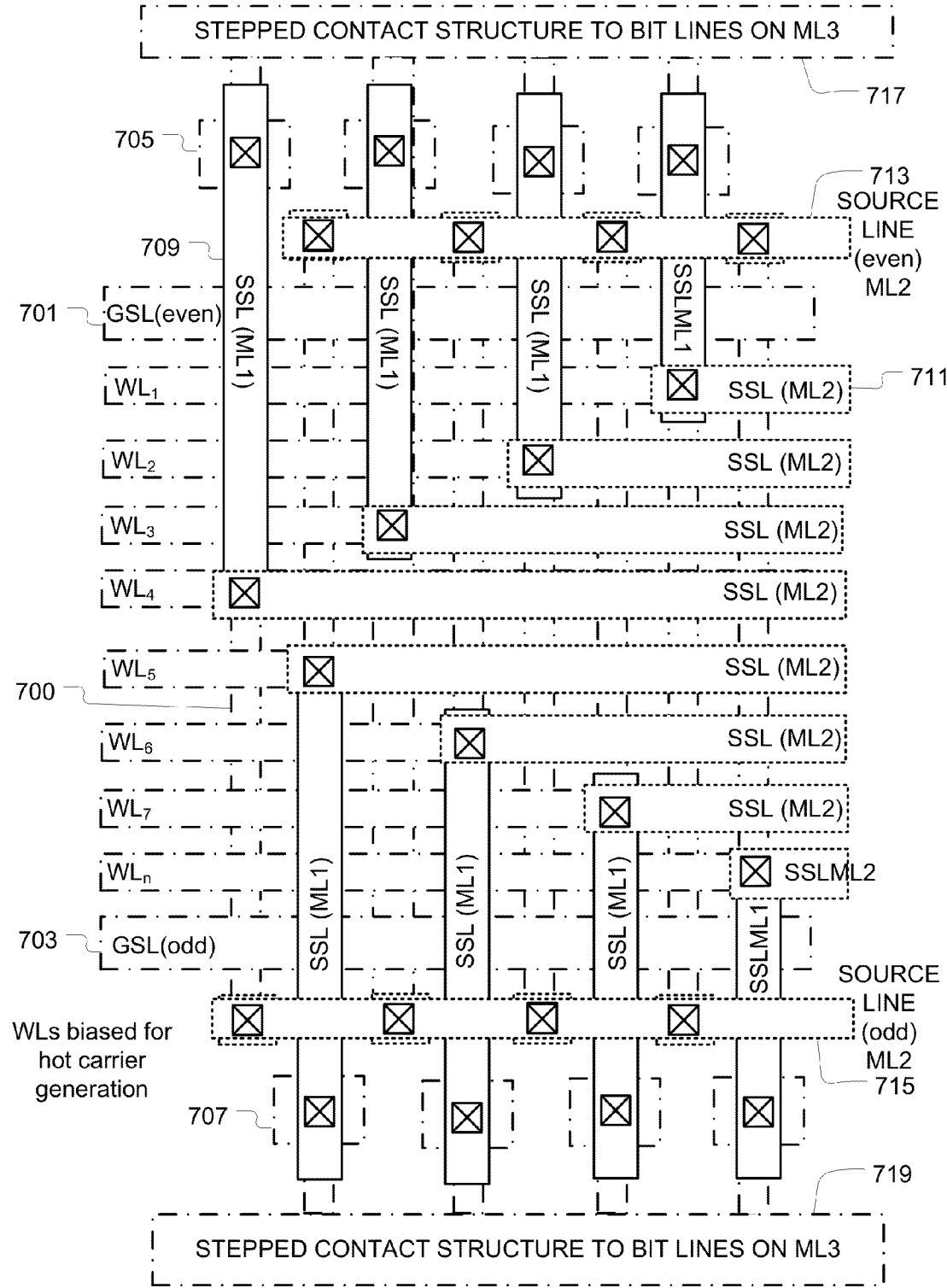
FIG. 34 is a layout view of the 3D NAND-flash memory array structure.

FIG. 34 is a layout view of the 3D NAND-flash memory array structure. The stacks of semiconductor strips (e.g., 700) are shown as vertical strips with dot-dash borders. Adjacent stacks of semiconductor strips alternate between the opposite orientations, of bit line end-to-source line end orientation, and source line end-to-bit line end orientation. Every other stack of semiconductor strips runs from the bit line structure at the top, to the source line at the bottom. Every other stack of semiconductor strips runs from the source line at the top, to the bit line structure at the bottom.

Overlying the stacks of semiconductor strips, are the horizontal word lines and the horizontal ground select lines GSL (even) 701 and GSL (odd) 703. Also overlying the stacks of semiconductor strips, are the SSL gate structures (e.g, 705, 707). The SSL gate structures overlie every other stack of semiconductor strips at the top end of the semiconductor strips, and overlie every other stack of semiconductor strips at the bottom end of the semiconductor strips. In either case, the SSL gate structures control electrical connection between any stack of semiconductor strips and the stack's corresponding bit line contact structure.

The shown word line numbering, ascending from 1 to N going from the top of the figure to the bottom of the figure, applies to even memory pages. For odd memory pages, the word line numbering descends from N to 1 going from the top of the figure to the bottom of the figure.

Overlying the word lines, ground select lines, and SSL gate structures, are the ML1 SSL string select lines (e.g., 709) running vertically. Overlying the ML1 SSL string select lines are the ML2 SSL (e.g., 711) string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couples these decoder signals to particular SSL gate structures to select particular stacks of semiconductor strips.

Also overlying the ML1 SSL string select lines are the source lines, even 713 and odd 715.

Further, overlying the ML2 SSL string select lines are the ML3 bit lines (not shown) which connect to the stepped contact structures at the top 717 and the bottom 719. Through the stepped contact structures, the bit lines select particular planes of semiconductor strips.

A new program method for NAND flash is provided which suppresses program disturb due to lower operation voltage. A new program based on use of boosted node potentials to achieve hot carrier injection enables use of reduced operation voltage. As a result of reduced operation voltages, the driving circuitry on the integrated circuit can be implemented using only one MOSFET process, without requiring additional high voltage MOSFET processes.

Compared to conventional channel hot electron injection operation, the BL voltage does not need to overcome the hot carrier injection barrier height. Thus, the BL voltage can be VCC or other voltages that are lower than requirements for conventional CHE programming voltage. Furthermore, the BL will not consume DC current during the hot carrier injection. So, the new program operation should achieve low power consumption.

Also, the WL voltage of this program method is lower than that required for conventional NAND flash FN programming operation. Thus very high voltage driving devices are not needed. Also, the vertical electric field across the tunnel oxide in the NAND flash array is smaller than that required for FN injection. As a result of lower E-field requirements, device reliability is better.

Furthermore, lower program and Vpass voltages than required for conventional FN operation cause reduced inter-WL dielectric voltages, and thus mitigate inter-WL dielectric breakdown issues that arise as the spacing between word lines shrinks.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a three-dimensional array of memory cells having a plurality of levels of memory cells;
a plurality of word lines, and a plurality of bit lines; and
control circuitry coupled to the plurality of word lines and the plurality of bit lines, adapted for programming a selected memory cell in a selected level of the array and on a selected word line, by hot carrier generation assisted FN tunneling, while inhibiting disturb in unselected memory cells in unselected levels and in the selected level and on unselected word lines by self-boosting, wherein the control circuitry during a program interval further performs:
applying a program disturb relief voltage to a program disturb relief word line to reduce program disturb during at least part of the program interval, another word line in between the selected word line and the program disturb relief word line, the program disturb relief voltage being less than drain-side pass voltages and source-side pass voltages, and
wherein the array includes semiconductor strips on which memory cells are arranged in series, and including programming the selected memory cell during the program interval by:
biasing one of a first end and a second end of the series of the memory cells in the series to a drain side voltage, and another of the first end and the second end to a source side voltage during the program interval,
applying the drain-side pass voltages to a first subset of the plurality of word lines between the selected word line and said one of the first end and the second end during the program interval,
applying the source-side pass voltages to a second subset of the plurality of word lines between the selected word line and said other of the first end and the second end during the program interval,
applying a program voltage to the selected word line during the program interval; and
applying a switching voltage to the switching word line of the plurality of word lines and to a corresponding memory cell of the memory cells in the series to control hot-carrier programming during at least part of the program interval, the switching word line being the another word line adjacent to the selected word line, and the corresponding memory cell adjacent to the selected memory cell.

2. The memory of claim 1, wherein the memory cells comprise floating body, dual gate memory cells.

3. The memory of claim 1, wherein the array comprises a plurality of stacks of semiconductor strips coupled via switches to contact pads, vertical word lines between the stacks with memory cells at cross points between the vertical word lines and the semiconductor strips, and the plurality of bit lines coupled to the contact pads.

4. The memory of claim 1, wherein the program interval includes a first program stage and a second program stage.

5. The memory of claim 4, wherein during the first stage the selected memory cell undergoes at least hot-carrier generation, and during the second stage the selected memory cell undergoes at least Fowler-Nordheim carrier injection.

6. The memory of claim 1, wherein the switching voltage is a first switching voltage during the first program stage and a second switching voltage during the second program stage, and the first switching voltage and the second switching voltage have opposite polarities.

7. The memory of claim 1, wherein the control circuitry applies the program disturb relief voltage to the program disturb relief word line of the plurality of word lines and to another corresponding memory cell of the memory cells in the series to reduce program disturb during at least part of the program interval, said another corresponding memory cell adjacent to the corresponding memory cell.

8. The memory of claim 1, wherein the program voltage is equal to the drain-side pass voltages and the source-side pass voltages.

9. The memory of claim 1, wherein during the program interval, the selected memory cell undergoes source-side boosting of hot-carrier programming of the selected memory cell.

10. The memory of claim 1, wherein during the program interval, the selected memory cell undergoes drain-side boosting of hot-carrier programming of the selected memory cell.

11. The memory of claim 1, further comprising:
a first select line controlling a first access transistor coupled to the first end of the series, the first end coupled to a source line; and
a second select line controlling a second access transistor coupled to the second end of the series, the second end coupled to a bit line; and
wherein during the program interval,
the control circuitry causes channel boosting in a semiconductor strip of the semiconductor strips between (i) part of the semiconductor strip controlled by the selected word line and (ii) part of the semiconductor strip controlled by the first select line, and
the control circuitry does not cause channel boosting in the semiconductor strip between (i) part of the semiconductor strip controlled by the switching word line and (ii) part of the semiconductor strip controlled by the second select line.

12. The memory of claim 1, further comprising:
memory cells arranged in a second series in a semiconductor strip of the semiconductor strips, wherein word lines in the plurality of word lines are coupled to corresponding memory cells in the second series of memory cells;
a first select line controlling a first access transistor coupled to the first end of the second series; and
a second select line controlling a second access transistor coupled to the second end of the second series; and
wherein during the program interval,
the control circuitry deselects the second series from programming, and
the control circuitry causes channel boosting in the semiconductor strip of the second series between (i) part of the semiconductor strip of the second series controlled by the first select line and (ii) part of the semiconductor strip of the second series controlled by the second select line, except for part of the semiconductor strip of the second series controlled by the switching word line.

13. The memory of claim 1, further comprising:
a first select line controlling a first access transistor coupled to the first end of the series, the first end coupled to a source line; and a second select line controlling a second access transistor coupled to the second end of the series, the second end coupled to a bit line; and wherein during the program interval, the control circuitry causes channel boosting in a semiconductor strip of the semiconductor strips between (i) part of the semiconductor strip controlled by the selected word line and (ii) part of the semiconductor strip controlled by the second select line, and the control circuitry does not cause channel boosting in the semiconductor strip between (i) part of the semiconductor strip controlled by the switching word line and (ii) part of the semiconductor strip controlled by the first select line.

14. The memory of claim 1, further comprising:

memory cells arranged in a second series in a semiconductor strip of the semiconductor strips, wherein word lines in the plurality of word lines are coupled to corresponding memory cells in the second series of memory cells;

a first select line controlling a first access transistor coupled to the first end of the second series; and a second select line controlling a second access transistor coupled to the second end of the second series; and wherein during the program interval, the control circuitry deselects the second series from programming, and the control circuitry does not cause channel boosting in the semiconductor strip of the second series between part of the semiconductor strip of the second series controlled by the first select line, and part of the semiconductor strip of the second series controlled by the second select line.

15. A method comprising:

programming a selected memory cell in a selected level of a three-dimensional array of memory cells and on a selected word line, by hot carrier generation assisted FN tunneling, while inhibiting disturb in unselected memory cells in unselected levels and in the selected level and on unselected word lines by self-boosting, and by applying a program disturb relief voltage to a program disturb relief word line to reduce program disturb during at least part of the program interval, another word line in between the selected word line and the program disturb relief word line, the program disturb relief voltage being less than drain-side pass voltages and source-side pass voltages, and wherein the array includes semiconductor strips on which memory cells are arranged in series, and including programming the selected memory cell during a program interval by:

biasing one of a first end and a second end of the series of memory cells to a drain side voltage, and another of the first end and the second end to a source side voltage during the program interval, applying the drain-side pass voltages to a first subset of the plurality of word lines between the selected word line and said one of the first end and the second end during the program interval, applying the source-side pass voltages to a second subset of the plurality of word lines between the selected word line and said other of the first end and the second end during the program interval, applying a program voltage to the selected word line during the program interval; and applying a switching voltage to a switching word line of the plurality of word lines and to a corresponding memory cell of the series of memory cells to control hot-carrier programming during the program interval, the switching word line being the another word line adjacent to the selected word line, and the corresponding memory cell adjacent to the selected memory cell.

16. The method of claim 15, wherein the program interval includes a first program stage and a second program stage.

17. The method of claim 16, wherein during the first stage the selected memory cell undergoes at least hot-carrier generation, and during the second stage the selected memory cell undergoes at least Fowler-Nordheim carrier injection.

18. The method of claim 16, wherein the switching voltage is a first switching voltage during the first program stage and a second switching voltage during the second program stage, and the first switching voltage and the second switching voltage have opposite polarities.

19. The method of claim 15, wherein the program disturb relief voltage is applied to the program disturb relief word line of the plurality of word lines and to another corresponding memory cell of the series of memory cells to reduce program disturb during at least part of the program interval, said another corresponding memory cell adjacent to the corresponding memory cell.

20. The method of claim 15, wherein the program voltage is equal to the drain-side pass voltages and the source-side pass voltages.

21. The method of claim 15, wherein during the program interval, the selected memory cell undergoes source-side boosting of hot-carrier programming of the selected memory cell.

22. The method of claim 15, wherein during the program interval, the selected memory cell undergoes drain-side boosting of hot-carrier programming of the selected memory cell.

23. A memory comprising:

a three-dimensional array of memory cells having a plurality of levels of memory cells;

a plurality of word lines, and a plurality of bit lines; and control circuitry coupled to the plurality of word lines and the plurality of bit lines, adapted for programming a selected memory cell in a selected level of the array and on a selected word line, by hot carrier generation assisted FN tunneling, while applying a program disturb relief voltage to a program disturb relief word line, the program disturb relief voltage being less than drain-side pass voltages and source-side pass voltages, another word line in between the selected word line and the program disturb relief word line, and wherein the array includes semiconductor strips on which memory cells are arranged in series, and including programming the selected memory cell during the program interval by:

biasing one of a first end and a second end of the series of the memory cells in the series to a drain side voltage, and another of the first end and the second end to a source side voltage during the program interval, applying the drain-side pass voltages to a first subset of the plurality of word lines between the selected word line and said one of the first end and the second end during the program interval, applying the source-side pass voltages to a second subset of the plurality of word lines between the selected word line and said other of the first end and the second end during the program interval, applying a program voltage to the selected word line during the program interval; and applying a switching voltage to the switching word line of the plurality of word lines and to a corresponding memory cell of the memory cells in the series to control hot-carrier programming during at least part of the program interval, the switching word line being the another word line adjacent to the selected word line, and the corresponding memory cell adjacent to the selected memory cell.

* * * * *